(12) United States Patent
Weingarten et al.

(10) Patent No.: US 8,694,715 B2
(45) Date of Patent: Apr. 8, 2014

(54) METHODS FOR ADAPTIVELY PROGRAMMING FLASH MEMORY DEVICES AND FLASH MEMORY SYSTEMS INCORPORATING SAME

(75) Inventors: Hanan Weingarten, Herzelia (IL); Erez Sabbag, Kiryat Bialik (IL); Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 668 days.

(21) Appl. No.: 12/596,680

(22) PCT Filed: Sep. 17, 2008

(86) PCT No.: PCT/IL2008/001242
§ 371 (c)(1),
(2), (4) Date: Oct. 20, 2009

(87) PCT Pub. No.: WO2009/053963
PCT Pub. Date: Apr. 30, 2009

(65) Prior Publication Data
US 2010/0146192 A1    Jun. 10, 2010

Related U.S. Application Data

(60) Provisional application No. 60/960,943, filed on Oct. 22, 2007, provisional application No. 60/996,782, filed on Dec. 5, 2007, provisional application No. 61/006,805, filed on Jan. 31, 2008, provisional application No. 61/064,853, filed on Mar. 31, 2008, provisional application No. 61/071,469, filed on Apr. 30, 2008, provisional application No. 61/129,414, filed on Jun. 25, 2008, provisional application No. 61/129,608, filed on Jul. 8, 2008, provisional application No. 61/071,465, filed on Apr. 30, 2008.

(51) Int. Cl.
G06F 12/00    (2006.01)

(52) U.S. Cl.
USPC ............ 711/103; 711/E12.015; 711/E12.069; 365/185.18; 365/185.11; 365/185.03

(58) Field of Classification Search
USPC ......................................................... 711/103
See application file for complete search history.

(56) References Cited

U.S. PATENT DOCUMENTS 4,463,375 A    7/1984    Macovski
4,584,686 A    4/1986    Fritze (Continued)

OTHER PUBLICATIONS

International Search Report and Written Opinion for Application No. PCT/IL2008/001242, dated Mar. 19, 2009.

(Continued)

*Primary Examiner* — Reginald Bragdon
*Assistant Examiner* — Hamdy S Ahmed
(74) *Attorney, Agent, or Firm* — Dentons US LLP

(57) ABSTRACT

A method for programming a plurality of data sequences into a corresponding plurality of flash memory functional units using a programming process having at least one selectable programming duration-controlling parameter controlling the duration of the programming process for a given data sequence, the method comprising providing at least one indication of at least one varying situational characteristic and determining a value for said at least one selectable programming duration-controlling parameter controlling the duration of the programming process for a given data sequence, for each flash memory functional unit, depending at least partly on said indication of said varying characteristic; and, for each individual flash memory functional unit from among said plurality of flash memory functional units, programming a sequence of bits into said individual flash memory functional unit using a programming process having at least one selectable parameter, said at least one selectable parameter being set at said value determined for said individual flash memory functional unit.

9 Claims, 20 Drawing Sheets

(56) References Cited

U.S. PATENT DOCUMENTS

| | | |
|---|---|---|
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 * | 1/2003 | Chevallier ........................ 377/20 |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |

(56) References Cited

U.S. PATENT DOCUMENTS

| | | |
|---|---|---|
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.

(56) References Cited

OTHER PUBLICATIONS

Dempster, et al., "Maximum Likelihood from Incomplete Data via the EM Algorithm", Journal of the Royal Statistical Society. Series B (Methodological), vol. 39, No. 1 (1997), pp. 1-38.

Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.

Daneshbeh, "Bit Serial Systolic Architectures for Multiplicative Inversion and Division over GF (2)", A thesis presented to the University of Waterloo, Ontario, Canada, 2005, pp. 1-118.

Chen, Formulas for the solutions of Quadratic Equations over GF (2), IEEE Trans. Inform. Theory, vol. IT-28, No. 5, Sep. 1982, pp. 792-794.

Berlekamp et al., "On the Solution of Algebraic Equations over Finite Fields", Inform. Cont. 10, Oct. 1967, pp. 553-564.

* cited by examiner

| Page | Row | Page | Row | Page | Row | Page | Row | Page | Row | Page | Row |
|---|---|---|---|---|---|---|---|---|---|---|---|
| 0 | 0 | 32 | 5 | 64 | 10 | 96 | 16 | 128 | 21 | 160 | 26 |
| 1 | 0 | 33 | 5 | 65 | 10 | 97 | 16 | 129 | 21 | 161 | 26 |
| 2 | 0 | 34 | 5 | 66 | 11 | 98 | 16 | 130 | 21 | 162 | 27 |
| 3 | 0 | 35 | 5 | 67 | 11 | 99 | 16 | 131 | 21 | 163 | 27 |
| 4 | 0 | 36 | 6 | 68 | 11 | 100 | 16 | 132 | 22 | 164 | 27 |
| 5 | 0 | 37 | 6 | 69 | 11 | 101 | 16 | 133 | 22 | 165 | 27 |
| 6 | 1 | 38 | 6 | 70 | 11 | 102 | 17 | 134 | 22 | 166 | 27 |
| 7 | 1 | 39 | 6 | 71 | 11 | 103 | 17 | 135 | 22 | 167 | 27 |
| 8 | 1 | 40 | 6 | 72 | 12 | 104 | 17 | 136 | 22 | 168 | 28 |
| 9 | 1 | 41 | 6 | 73 | 12 | 105 | 17 | 137 | 22 | 169 | 28 |
| 10 | 1 | 42 | 7 | 74 | 12 | 106 | 17 | 138 | 23 | 170 | 28 |
| 11 | 1 | 43 | 7 | 75 | 12 | 107 | 17 | 139 | 23 | 171 | 28 |
| 12 | 2 | 44 | 7 | 76 | 12 | 108 | 18 | 140 | 23 | 172 | 28 |
| 13 | 2 | 45 | 7 | 77 | 12 | 109 | 18 | 141 | 23 | 173 | 28 |
| 14 | 2 | 46 | 7 | 78 | 13 | 110 | 18 | 142 | 23 | 174 | 29 |
| 15 | 2 | 47 | 7 | 79 | 13 | 111 | 18 | 143 | 23 | 175 | 29 |
| 16 | 2 | 48 | 8 | 80 | 13 | 112 | 18 | 144 | 24 | 176 | 29 |
| 17 | 2 | 49 | 8 | 81 | 13 | 113 | 18 | 145 | 24 | 177 | 29 |
| 18 | 3 | 50 | 8 | 82 | 13 | 114 | 19 | 146 | 24 | 178 | 29 |
| 19 | 3 | 51 | 8 | 83 | 13 | 115 | 19 | 147 | 24 | 179 | 29 |
| 20 | 3 | 52 | 8 | 84 | 14 | 116 | 19 | 148 | 24 | 180 | 30 |
| 21 | 3 | 53 | 8 | 85 | 14 | 117 | 19 | 149 | 24 | 181 | 30 |
| 22 | 3 | 54 | 9 | 86 | 14 | 118 | 19 | 150 | 25 | 182 | 30 |
| 23 | 3 | 55 | 9 | 87 | 14 | 119 | 19 | 151 | 25 | 183 | 30 |
| 24 | 4 | 56 | 9 | 88 | 14 | 120 | 20 | 152 | 25 | 184 | 30 |
| 25 | 4 | 57 | 9 | 89 | 14 | 121 | 20 | 153 | 25 | 185 | 30 |
| 26 | 4 | 58 | 9 | 90 | 15 | 122 | 20 | 154 | 25 | 186 | 31 |
| 27 | 4 | 59 | 9 | 91 | 15 | 123 | 20 | 155 | 25 | 187 | 31 |
| 28 | 4 | 60 | 10 | 92 | 15 | 124 | 20 | 156 | 26 | 188 | 31 |
| 29 | 4 | 61 | 10 | 93 | 15 | 125 | 20 | 157 | 26 | 189 | 31 |
| 30 | 5 | 62 | 10 | 94 | 15 | 126 | 21 | 158 | 26 | 190 | 31 |
| 31 | 5 | 63 | 10 | 95 | 15 | 127 | 21 | 159 | 26 | 191 | 31 |

Fig. 5

|     | Even Pages | | | Odd Pages | | |
| --- | --- | --- | --- | --- | --- | --- |
| Row | MSB | CSB | LSB | MSB | CSB | LSB |
| 0 | 0 | 2 | 4 | 1 | 3 | 5 |
| 1 | 6 | 8 | 10 | 7 | 9 | 11 |
| 2 | 12 | 14 | 16 | 13 | 15 | 17 |
| 3 | 18 | 20 | 22 | 19 | 21 | 23 |
| 4 | 24 | 26 | 28 | 25 | 27 | 29 |
| 5 | 30 | 32 | 34 | 31 | 33 | 35 |
| 6 | 36 | 38 | 40 | 37 | 39 | 41 |
| 7 | 42 | 44 | 46 | 43 | 45 | 47 |
| 8 | 48 | 50 | 52 | 49 | 51 | 53 |
| 9 | 54 | 56 | 58 | 55 | 57 | 59 |
| 10 | 60 | 62 | 64 | 61 | 63 | 65 |
| 11 | 66 | 68 | 70 | 67 | 69 | 71 |
| 12 | 72 | 74 | 76 | 73 | 75 | 77 |
| 13 | 78 | 80 | 82 | 79 | 81 | 83 |
| 14 | 84 | 86 | 88 | 85 | 87 | 89 |
| 15 | 90 | 92 | 94 | 91 | 93 | 95 |
| 16 | 96 | 98 | 100 | 97 | 99 | 101 |
| 17 | 102 | 104 | 106 | 103 | 105 | 107 |
| 18 | 108 | 110 | 112 | 109 | 111 | 113 |
| 19 | 114 | 116 | 118 | 115 | 117 | 119 |
| 20 | 120 | 122 | 124 | 121 | 123 | 125 |
| 21 | 126 | 128 | 130 | 127 | 129 | 131 |
| 22 | 132 | 134 | 136 | 133 | 135 | 137 |
| 23 | 138 | 140 | 142 | 139 | 141 | 143 |
| 24 | 144 | 146 | 148 | 145 | 147 | 149 |
| 25 | 150 | 152 | 154 | 151 | 153 | 155 |
| 26 | 156 | 158 | 160 | 157 | 159 | 161 |
| 27 | 162 | 164 | 166 | 163 | 165 | 167 |
| 28 | 168 | 170 | 172 | 169 | 171 | 173 |
| 29 | 174 | 176 | 178 | 175 | 177 | 179 |
| 30 | 180 | 182 | 184 | 181 | 183 | 185 |
| 31 | 186 | 188 | 190 | 187 | 189 | 191 |

| Cycle count index | Cycle count range | Row 0 | | Rows 1 – 30 | | Row 31 | |
|---|---|---|---|---|---|---|---|
| | Cycle range | ISPP {MSB, CSB, LSB} | Program levels {3 BPC} | ISPP {MSB, CSB, LSB} | Program levels {3 BPC} | ISPP {MSB, CSB, LSB} | Program levels {3 BPC} |
| 0 | 0 – 200 | {1, 0.5, 0.4} | {0.3900, 1.5210, 2.3520, 3.2960, 4.1890, 5.1030 6.0920} | {1, 0.5, 0.45} | {0.4000, 1.5530, 2.3570, 3.3200, 4.1730, 5.1070, 6.1000} | {1, 0.5, 0.4} | {0.4830, 1.5850, 2.3990, 3.3540, 4.2340, 5.1570, 6.1340} |
| 1 | 201 – 500 | {1, 0.5, 0.35} | {0.4260, 1.4420, 2.3000, 3.2750, 4.1380, 5.0910, 6.0540} | {1, 0.5, 0.35} | {0.4800, 1.5430, 2.3470, 3.2500, 4.1530, 5.1070, 6.1000} | {1, 0.5, 0.35} | {0.4940, 1.5270, 2.3750, 3.3280, 4.1980, 5.1470, 6.1040} |
| 2 | 501 – 1250 | {1, 0.5, 0.2} | {0.5230, 1.5640, 2.4080, 3.3830, 4.1800, 5.1640, 6.0630} | {1, 0.5, 0.2} | {0.5600, 1.5930, 2.4470, 3.4000, 4.1930, 5.1570, 6.1000} | {1, 0.5, 0.2} | {0.6010, 1.6100, 2.4660, 3.4330, 4.2490, 5.2040, 6.1250} |
| 3 | 1251 – 2000 | {1, 0.5, 0.2} | {0.5110, 1.5520, 2.3980, 3.3880, 4.1940, 5.1480, 6.0730} | {1, 0.5, 0.2} | {0.5400, 1.5930, 2.4470, 3.4100, 4.2130, 5.1670, 6.1000} | {1, 0.5, 0.2} | {0.5720, 1.6160, 2.4730, 3.4470, 4.2590, 5.1950, 6.1180} |
| 4 | > 2000 | {1, 0.5, 0.2} | {0.6800, 1.8030, 2.6670, 3.6300, 4.4330, 5.4670, 6.3950} | {1, 0.5, 0.2} | {0.5700, 1.6930, 2.5570, 3.5200, 4.3230, 5.3570, 6.4400} | {1, 0.5, 0.2} | {0.6800, 1.8030, 2.6670, 3.6300, 4.4330, 5.4670, 6.4171} |

| Cycle count index | Cycle count range | Row 0 ISPP {MSB, CSB, LSB} | Row 0 Program levels {3 BPC} | Rows 1-30 ISPP {MSB, CSB, LSB} | Rows 1-30 Program levels {3 BPC} | Row 31 ISPP {MSB, CSB, LSB} | Row 31 Program levels {3 BPC} |
|---|---|---|---|---|---|---|---|
| 0 | 0 – 200 | {1, 0.5, 0.4} | {0.4600, 1.5000, 2.2810, 3.1730, 4.0090, 5.1450, 6.1220} | {1, 0.5, 0.45} | {0.4400, 1.5330, 2.2770, 3.2100, 3.9830, 5.0970, 6.1000} | {1, 0.5, 0.4} | {0.5880, 1.5620, 2.3340, 3.2240, 4.0510, 5.1950, 6.1750} |
| 1 | 201 – 500 | {1, 0.5, 0.35} | {0.5330, 1.4360, 2.2480, 3.1840, 3.9670, 5.0690, 6.1100} | {1, 0.5, 0.45} | {0.5200, 1.4930, 2.2670, 3.2100, 3.9530, 5.0370, 6.1000} | {1, 0.5, 0.35} | {0.6010, 1.5390, 2.3190, 3.2570, 4.0220, 5.1120, 6.1680} |
| 2 | 501 – 1250 | {1, 0.5, 0.3} | {0.6070, 1.5520, 2.4020, 3.3610, 4.1760, 5.1170, 6.0690} | {1, 0.5, 0.3} | {0.6100, 1.5830, 2.4170, 3.3700, 4.1830, 5.1370, 6.1000} | {1, 0.5, 0.3} | {0.6770, 1.6360, 2.4780, 3.4300, 4.2430, 5.1870, 6.1390} |
| 3 | 1251 – 2000 | {1, 0.5, 0.2} | {0.6350, 1.5770, 2.4060, 3.3600, 4.1720, 5.1480, 6.0800} | {1, 0.5, 0.2} | {0.6400, 1.5930, 2.4270, 3.3700, 4.1630, 5.1370, 6.1000} | {1, 0.5, 0.2} | {0.7220, 1.6600, 2.4770, 3.4060, 4.2390, 5.1760, 6.1060} |
| 4 | > 2000 | {1, 0.5, 0.2} | {0.6800, 1.8030, 2.6670, 3.6300, 4.4330, 5.4670, 6.3770} | {1, 0.5, 0.2} | {0.6800, 1.8030, 2.6670, 3.6300, 4.4330, 5.4670, 6.4400} | {1, 0.5, 0.2} | {0.6800, 1.8030, 2.6670, 3.6300, 4.4330, 5.4670, 6.4380} |

Fig. 19

METHODS FOR ADAPTIVELY PROGRAMMING FLASH MEMORY DEVICES AND FLASH MEMORY SYSTEMS INCORPORATING SAME

CROSS-REFERENCE TO RELATED APPLICATIONS

This application is a National Phase Application of PCT International Application No. PCT/IL2008/001242, entitled "METHODS FOR ADAPTIVELY PROGRAMMING FLASH MEMORY DEVICES AND FLASH MEMORY SYSTEMS INCORPORATING SAME" International Filing Date Sep. 17, 2008, published on Apr. 30, 2009 as International Publication No. WO 2009/053963, which in turn claims priority from Priority is claimed from U.S. Provisional Application No. 61/129,414, filed Jun. 25, 2008, U.S. Provisional Application No. 61/006,805, filed Jan. 31, 2008, U.S. Provisional Application No. 61/071,465, filed Apr, 30, 2008, U.S. Provisional Application No. 60/996,782, filed Dec. 5, 2007, U.S. Provisional Application No. 61/064,853, filed Mar. 31, 2008, U.S. Provisional Application No. 61/129,608, filed Jul. 8, 2008, U.S. Provisional Application No. 60/960,943, filed Oct. 22, 2007, U.S. Provisional Application No. 61/071,469, filed Apr. 30, 2008, all of which are incorporated herein by reference in their entirety.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", and several other co-pending patent applications being filed concurrently (same day).

FIELD OF THE INVENTION

The present invention relates generally to flash memory devices and more particularly to programming thereof.

BACKGROUND OF THE INVENTION

Conventional flash memory technology is described in the following publications inter alia:

[1] Paulo Cappelletti, Clara Golla, Piero Olivo, Enrico Zanoni, "Flash Memories", Kluwer Academic Publishers, 1999

[2] G. Campardo, R. Micheloni, D. Novosel, "VLSI-Design of Non-Volatile Memories", Springer Berlin Heidelberg New York, 2005

[3] U.S. Pat. No. 6,3301,151 to Engh et al; U.S. Pat. No. 7,151,701 to Combe et al; U.S. Pat. No. 7,292,473 to Niset et al; and U.S. Pat. No. 7,355,896 to Li et al; as well as published PCT document WO 2006138333 and published European patent document EP 1833058.

[4] J. E. Brewer and M. Gill, "Nonvolatile memory technologies with emphasis on flash," IEEE press series on Microelectronic Systems, John Wiley & Sons, inc., 2008.

The disclosures of all publications and patent documents mentioned in the specification, and of the publications and patent documents cited therein directly or indirectly, are hereby incorporated by reference.

SUMMARY OF THE INVENTION

The following terms may be construed either in accordance with any definition thereof appearing in the prior art literature or in accordance with the specification, or as follows:

Bit error rate (BER)=a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device e.g. 10 years.

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Logical page: a portion of typically sequential data, whose amount is typically less than or equal to a predetermined amount of data defined to be a pageful of data, which has typically been defined by a host (data source/destination) or user thereof, as a page, and which is sent by the host to a flash memory device for storage and is subsequently read by the host from the flash memory device.

Mapping: basic cell-level writing function in which incoming digital n-tuple is mapped to a program level by inducing a program level in the cell, having a predetermined correspondence to the incoming logical value.

Physical Page=A portion, typically 512 or 2048 or 4096 bytes in size, of a flash memory e.g. a NAND or NOR flash memory device. Writing and reading is typically performed physical page by physical page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages. Alternatively, a physical page is an ordered set (e.g. sequence or array) of flash memory cells which are all written in simultaneously by each write operation, the set typically comprising a predetermined number of typically physically adjacent flash memory cells containing actual data written by and subsequently read by the host, as well as, typical error correction information and back pointers used for recognizing the true address of a page.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than, or equal to, the number of Mapping levels ($2^n$ where n=number of bits per cell).

Present level, Charge level: The amount of charge in the cell. The amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reliability: Reliability of a flash memory device may be operationalized as the probability that a worst-case logical page written and stored in that device for a predetermined long time period such as 10 years will be successfully read i.e. that sufficiently few errors, if any, will be present in the physical page/s storing each logical page such that the error code appended to the logical page will suffice to overcome those few errors.

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically, recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with $2^n$ levels stores n bits. Low resolution (partitioning the window, W, of physical values a cell can assume into a small rather than large number of levels per cell) provides high reliability.

Retention: Retention of original physical levels induced in the flash memory cells despite time which has elapsed and despite previous erase/write cycles; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level or "decision level": the voltage (e.g.) against which the charge level of a cell is measured. For example, a cell may be said to store a particular digital n-tuple D if the charge level or other physical level of the cell falls between two threshold values T.

Code rate: ratio of redundancy bits to data bits in flash memory.

Data cells: cells storing data provided by host as opposed to "non-data cells" which do not store host-provided data, and may, for example, store instead error correction information, management information, redundancy information, spare bits or parity bits.

Logical page: a set of bits defined as a page typically having a unique page address, by a host external to a flash memory device.

In the present specification, the terms "row" and "column" refer to rows of cells and columns of cells, respectively and are not references to sub-divisions of a logical page.

The term "MSB" is used herein to denote the bit which is programmed into a multi-level cell, storing several bits, first. The term "LSB" is used herein to denote the bit which is programmed into the multi-level cell, last. The term "CSB" is used herein to denote the bit which is programmed into a 3-level cell, storing 3 bits, second, i.e. after the MSB and before the LSB. It is appreciated that more generally, e.g. if the multi-level cell stores 4 or more levels, there are more than one CSB and use of the term "CSB" herein, which implies that the cell is a 3-level cell, is merely by way of example and is not intended to be limiting.

A logical page is a set of bytes which is meaningful to an application. The location of a logical page in memory is termed herein a physical page. This location may comprise certain cells in their entirety, or, more commonly, may comprise only one or some bits within certain cells. The locations of each of a logical sequence of logical pages (page 0, page 1, page 2, . . . ) within memory is pre-determined by a suitable mapping scheme mapping logical pages into the bits of the cells of a particular erase sector (block) in flash memory.

"Successfully reconstructed" means that using error correction code, the original logical page has been reconstructed generally satisfactorily, e.g., typically, that the logical page has been read, using reading thresholds, has undergone error correction as necessary and has successfully passed its CRC (cyclic redundancy check) criterion.

"Bit errors" are those errors found in the physical page corresponding to a logical page, which typically are corrected using ECC (error correction code) such that the page is successfully reconstructed despite these errors.

The term "reading threshold" and "detection threshold" are used generally interchangeably.

In the context of the present application, the term "programming" comprises the following operations: Take as input a sequence of bits to be stored in memory, transform respectively into "programmed values" which are physical values which are taken to represent these bits and induce the programmed values in cells of flash memory, resulting in physical values which cluster around the programmed values respectively. The term "program" in this application does not necessarily include the process of coding e.g. error correction coding in which redundancy bits are added. Typically, programming is a final procedure which transforms a sequence of binary logical values which have previously undergone processes such as scrambling, addition of CRC, and coding.

A programming process is a method for inducing given programmed values in flash memory cells. Typically, the programming process involves a sequence of voltage pulses applied to a flash memory cell, each pulse increasing the voltage level of the cell. After each such pulse, the process may determine whether or not to continue, depending on whether the programmed value has been achieved.

"Degradation state" is a changing characteristic of a flash memory device indicating the quality of storage provided by the device, e.g. the accuracy of data retrieved from the device.

A "duration controlling parameter" is a parameter which is monotonically related to the duration of programming (i.e. the duration controlling parameter is either a monotonically increasing function of the duration or a monotonically decreasing function of the duration) to the extent that the duration controlling parameter is increased, the duration either increases (if the parameter is an increasing function of the duration) or decreases (if the parameter is a decreasing function of the duration) such that a range of desired decreases of the duration is achievable by suitable modification of the duration controlling parameter.

The term "Even row-half" refers to cells within a physical flash memory row whose indices are even numbers e.g. cells 0, 2, 4, . . . in a particular row. The term "odd row-half" refers to cells within a physical flash memory row whose indices are odd numbers e.g. cells 1, 3, 5, . . . in a particular row. Bits of a logical page are usually mapped to a particular bit position (such as the MSB, CSB or LSB position) of all cells in a particular even row-half or odd row-half. The number of bits per page typically equals the number of cells in a row-half and therefore if each cell is an 8-level cell which stores 3 bits then there are 3 logical pages stored in each row-half. Given a logical page, the particular row-half in which it is stored, and the particular bit within the row-half in which it resides (MSB, CSB or LSB) are typically determined by what is available.

Certain embodiments of the present invention seek to provide improved methods and systems for programming flash memory.

Certain embodiments of the present invention seek to solve a problem which includes increasing efficiency of programming e.g. by increasing Incremental Step pulse Programming when possible.

Certain embodiments of the present invention seek to solve a problem which includes compensating for poor quality rows, e.g. by selecting row-appropriate program levels.

According to certain embodiments of the present invention, programming proceeds at least partly according to situational characteristics such as but not limited to the degradation state of the flash device. The manner in which a given digital sequence is programmed to a flash memory device changes in accordance with gathered situational information such as but not limited to a fluctuating state of the flash memory, whether at the cell level, page level, erase sector level or device level. The manner in which a sequence is programmed may or may not additionally depend on the data content of that sequence.

There is thus provided, in accordance with at least one embodiment of the present invention, a method for programming a plurality of data sequences into a corresponding plurality of flash memory functional units using a programming process having at least one selectable programming duration-controlling parameter controlling the duration of the programming process for a given data sequence, the method comprising providing at least one indication of at least one varying situational characteristic and determining a value for the at least one selectable programming duration-controlling parameter controlling the duration of the programming process for a given data sequence, for each flash memory functional unit, depending at least partly on the indication of the varying characteristic; and, for each individual flash memory functional unit from among the plurality of flash memory functional units, programming a sequence of bits into the individual flash memory functional unit using a programming process having at least one selectable parameter, the at least one selectable parameter being set at the value determined for the individual flash memory functional unit.

Further in accordance with at least one embodiment of the present invention, the varying situational characteristic comprises a varying characteristic of each flash memory functional unit from among the plurality of flash memory functional units.

Still further in accordance with at least one embodiment of the present invention, the varying situational characteristic comprises at least one characteristic of an application to which a flash memory functional unit has been assigned.

Additionally in accordance with at least one embodiment of the present invention, the characteristic of the application comprises the duration of time for which information in the flash memory functional unit is to be maintained.

Further in accordance with at least one embodiment of the present invention, the varying characteristic comprises a degradation state.

Still further in accordance with at least one embodiment of the present invention, the at least one indication comprises a cycle count of an individual flash memory functional unit.

Further in accordance with at least one embodiment of the present invention, the programming process comprises generating at least two pulses and wherein the selectable parameter comprises the difference between the voltages of the two pulses. Still further in accordance with at least one embodiment of the present invention, the flash memory functional unit comprises an entire flash memory device.

Additionally in accordance with at least one embodiment of the present invention, the flash memory functional unit comprises an erase sector.

Also in accordance with at least one embodiment of the present invention, the flash memory functional unit comprises at least one row in a flash memory erase sector.

Also provided, in accordance with certain embodiments of the present invention, is a system for programming a plurality of data sequences using a programming process having at least one selectable programming duration-controlling parameter controlling the duration of the programming process for a given data sequence, the system comprising a plurality of flash memory functional units into which the plurality of data sequences are to be programmed, a situational analyzer operative to provide at least one indication of at least one varying situational characteristic and to determine a value for the at least one selectable programming duration-controlling parameter controlling the duration of the programming process for a given data sequence, for each flash memory functional unit, depending at least partly on the indication of the varying characteristic; and a bit sequence programmer operative, for each individual flash memory functional unit from among the plurality of flash memory functional units, to program a sequence of bits into the individual flash memory functional unit using a programming process having at least one selectable parameter which is set at the value determined for the individual flash memory functional unit.

Further provided, in accordance with certain embodiments of the present invention, is a method for rapidly programming at least two bits per cell, in a population of pages belonging to respective erase sectors in flash memory, the population of pages defining a multiplicity of cells, the method comprising, for at least one cell, initially programming at least one first bit into the cell thereby to induce one of a first plurality of program levels in the cell, the first plurality of program levels including an erase level, and subsequently programming at least one second bit into the cell, thereby to induce one of a second plurality of program levels in the cell, the second plurality exceeding the first plurality in number, wherein the second plurality of program levels includes at least one of the program levels in the first plurality of program levels other than the erase level.

Additionally in accordance with at least one embodiment of the present invention, the second plurality of program levels includes all of the program levels in the first plurality of program levels.

Further in accordance with at least one embodiment of the present invention, the at least one cell comprises only cells in pages belonging to erase sectors having a predeterminedly low cycle count.

Still further in accordance with at least one embodiment of the present invention, the at least one cell comprises all cells in pages belonging to erase sectors having a predeterminedly low cycle count.

Also provided, in accordance with certain embodiments of the present invention, is a system for rapidly programming at least two bits per cell, in a population of pages belonging to respective erase sectors in flash memory, the population of pages defining a multiplicity of cells, the system comprising a bit programmer operative to initially program at least one first bit into at least one cell thereby to induce one of a first plurality of program levels in the cell, the first plurality of program levels including an erase level, and for at least one cell, to subsequently program at least one second bit into the cell, thereby to induce one of a second plurality of program levels in the cell, the second plurality exceeding the first plurality in number, wherein the second plurality of program levels includes at least one of the program levels in the first plurality of program levels other than the erase level.

Additionally provided, in accordance with certain embodiments of the present invention, is a method for programming data into a first plurality of rows within a second plurality of erase sectors of a flash memory device using a programming process having at least one selectable parameter, the method comprising characterizing each of at least one row subsets, each row subset comprising at least one row from among the first plurality of rows, thereby to generate at least one row subset characteristic value and programming data into at least a portion of at least one individual row belonging to at least one row subset, using a programming process having at least one selectable parameter, the at least one selectable parameter being set at least partly in accordance with the row subset characteristic value characterizing a row subset to which the individual row belongs.

For example, there may be 3 row subsets per erase sector, the first subset having just one member: the first row from among the 32 (say) rows in the erase sector, the second subset also having just one member: the last row in the erase sector, and the third subset comprising the remaining rows in the erase sector (30 rows if the erase sector includes 32 rows).

When data is said to be "programmed into rows" and the like, it actually is often programmed into only a portion of a row, such as an even row-half or an odd row-half.

Further in accordance with at least one embodiment of the present invention, the at least one row subset comprises a third plurality of row subsets partitioning the first plurality of rows.

Still further in accordance with at least one embodiment of the present invention, each individual row subset within the third plurality of row subsets comprises a set of rows having an individual row position within erase sectors to which the set of rows respectively belong.

Additionally in accordance with at least one embodiment of the present invention, the at least one selectable parameter comprises at least one program level of at least one cell.

Further in accordance with at least one embodiment of the present invention, the at least one selectable parameter comprises an Incremental Step pulse Programming step voltage.

Still further in accordance with at least one embodiment of the present invention, the row subset characteristic value is indicative of quality of storage provided by at least one row in the subset.

Additionally in accordance with at least one embodiment of the present invention, if the row subset characteristic value indicates that a row's quality of storage is low, a low Incremental Step pulse Programming programming pulse is used and if the row characteristic value indicates that a row's quality of storage is high, a high Incremental Step pulse Programming programming pulse is used.

Also provided, in accordance with certain embodiments of the present invention, is a system for programming data into a first plurality of rows within a second plurality of erase sectors of a flash memory device using a programming process having at least one selectable parameter, the system comprising a row subset analyzer operative to characterize each of at least one row subsets, each row subset comprising at least one row from among the first plurality of rows, thereby to generate at least one row subset characteristic value; and a row subset-dependent programmer operative to program data into at least a portion of at least one individual row belonging to at least one row subset, using a programming process having at least one selectable parameter, the at least one selectable parameter being set at least partly in accordance with the row subset characteristic value characterizing a row subset to which the individual row belongs.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIG. 5 is a page-to-row table used by the method of FIG. 4 in accordance with certain embodiments of the present invention;

FIG. 9 is a page-to-type table useful in accordance with certain embodiments of the present invention;

in FIGS. 10, 12-13, 15-16, all in accordance with certain embodiments of the present invention;

FIG. 18 is a table holding adaptive programming parameters for even pages which is useful in accordance with certain embodiments of the present invention;

FIG. 19 is a table holding adaptive programming parameters for odd pages which is useful in accordance with certain embodiments of the present invention;

DETAILED DESCRIPTION OF CERTAIN EMBODIMENTS

Conventional Flash memory devices store information as charge in "cells", each made of either a floating gate transistor or an NROM transistor. In single-level cell (SLC) devices, each cell stores only one bit of information. Multi-level cell (MLC) devices can store more than one bit per cell by choosing between multiple levels of electrical charge to apply to the floating gates of their cells. The amount of charge (also known as charge level) is then measured by a detector, by comparing the voltage of the transistor gate (also known as charge level and denoted $V_T$) to a decision threshold voltage (also known as charge level boundary point and denoted $V_D$). The amount of charge is then used to determine the programmed level (logical value) of the cell. Due to inaccuracies during the programming procedure and charge loss due to time and temperature (also known as retention), the measured levels suffer from a random distortion.

Figure 1:
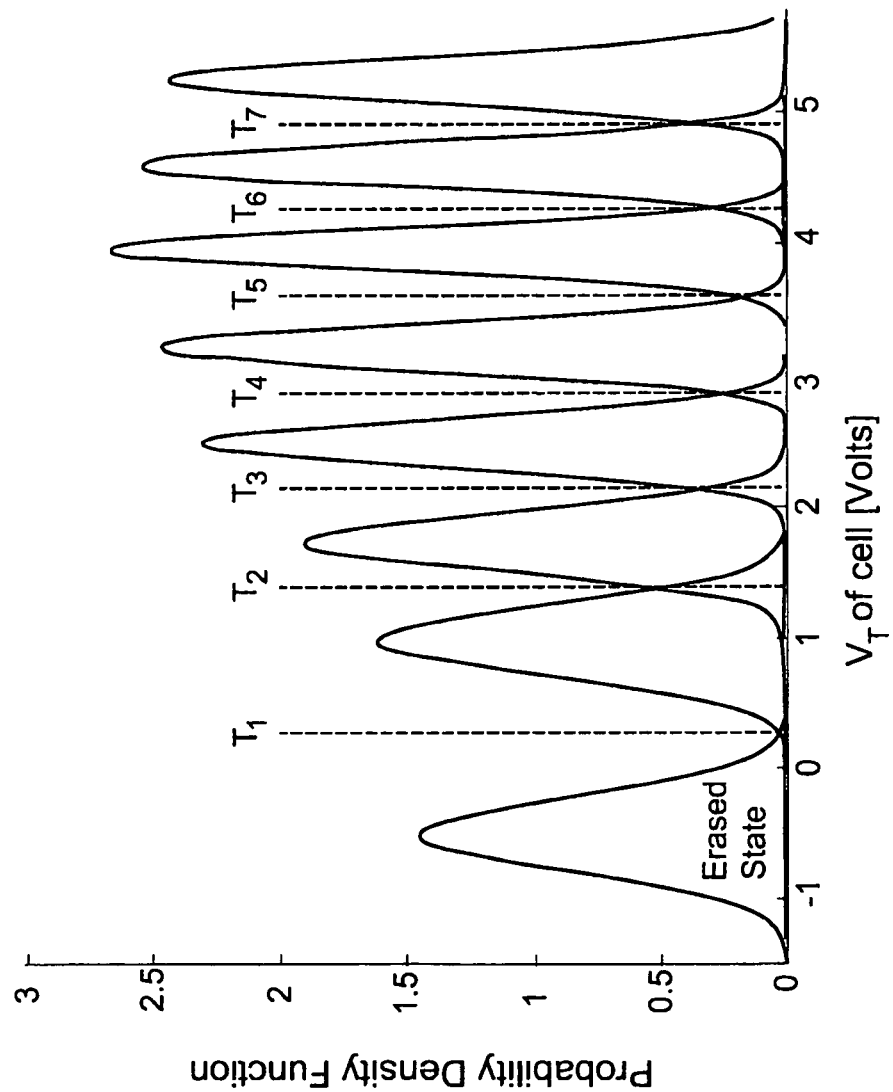
FIG. 1 is a prior art graph of a theoretical probability density function of program levels as a function of a flash memory cell's voltage.

FIG. 1 illustrates an example of the eight (8) separate probability distributions of a cell which can be programmed with one of eight (8) corresponding program levels (111, 110, 100, 101, 001, 000, 010, and 011, respectively). For each distribution curve, the Y-axis represents the probability that the cell is programmed to the corresponding level, given the value of the charge level $V_T$ (represented by the x-axis).

The cell's programmed level may be determined using several methods. One method is to apply a voltage to the cell's gate and measure if the cell conducts current. The cell has a certain threshold voltage such that if voltage above that threshold is applied to the gate, the gate will conduct. Below that threshold voltage the gate does not conduct current, or conducts a small amount of current, below a certain demarcation level. As the amount of charge in the cell changes this threshold voltage, the charge may be inferred by determining at which voltage the cell starts to conduct current. Thus, the programmed level is determined by iteratively applying different voltages to the gate and measuring whether the cells conduct or not. Another method is based on the fact that when applying a voltage above the threshold voltage, the cell conducts current and the amount of current depends on the difference between the applied voltage and the threshold voltage. As the threshold voltage changes as a function of the amount of charge in the cell, the programmed level may be inferred by measuring the current going through the cell.

A programmed level may therefore be obtained by simultaneously comparing the conducted current with a given set of fixed currents distinguishing between all programmed levels. In other words, each cell's programmed level may be determined by simultaneously comparing the $V_T$ level against several decision threshold levels (detection thresholds). For example, if there are eight (8) possible programmed levels, the cell's $V_T$ is simultaneously compared against seven decision threshold levels which divide the voltage axis into eight (8) regions, as demonstrated in FIG. 1.

As aforesaid, in MLC flash devices, each cell can store more than one bit per cell. The program level of each cell is determined by an n-tuple of bits (e.g., n=1, 2, 3). However, this does not mean that the cell is directly programmed to one of its possible program levels in a single step. In state-of-the-art flash devices, the program levels may be written in stages, where in each stage only a single bit is programmed. This procedure is depicted in prior art FIG. 2 for a flash memory device storing 3 bits per cell.

Figure 10:
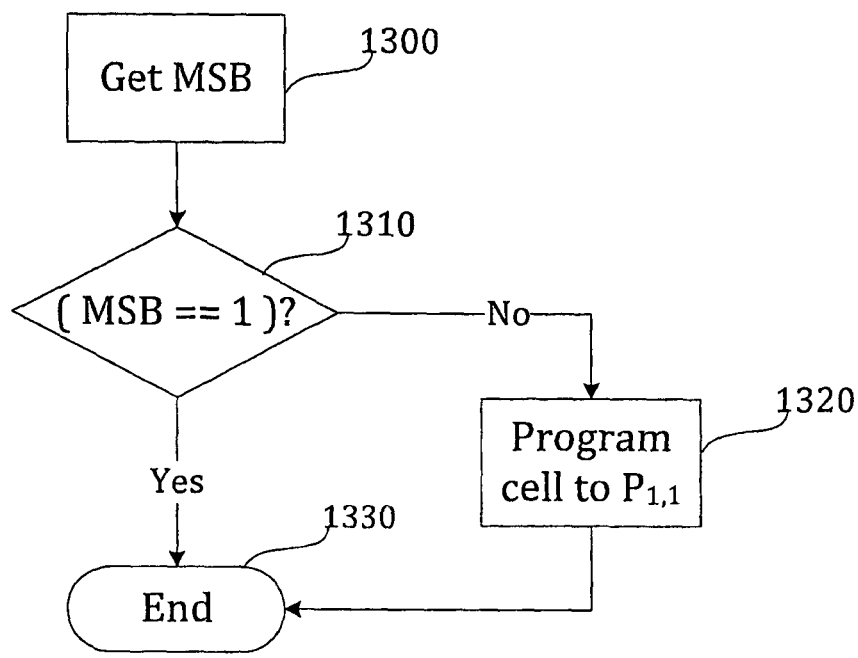
FIG. 10 is a simplified flowchart illustration of an MSB programming method useful in implementing certain embodiments of the present invention.

Programming of the most significant bit (MSB) to a cell is effected using a single program level (in addition to the erase level). If the MSB of the cell equals 1, no programming is done and the cell remains in the erase state. Otherwise, if the MSB of the cell equals 0, the cell is programmed to a positive program level, namely $P_{1,1}$. The programming procedure for the MSB is depicted in FIG. 10.

Figure 13:
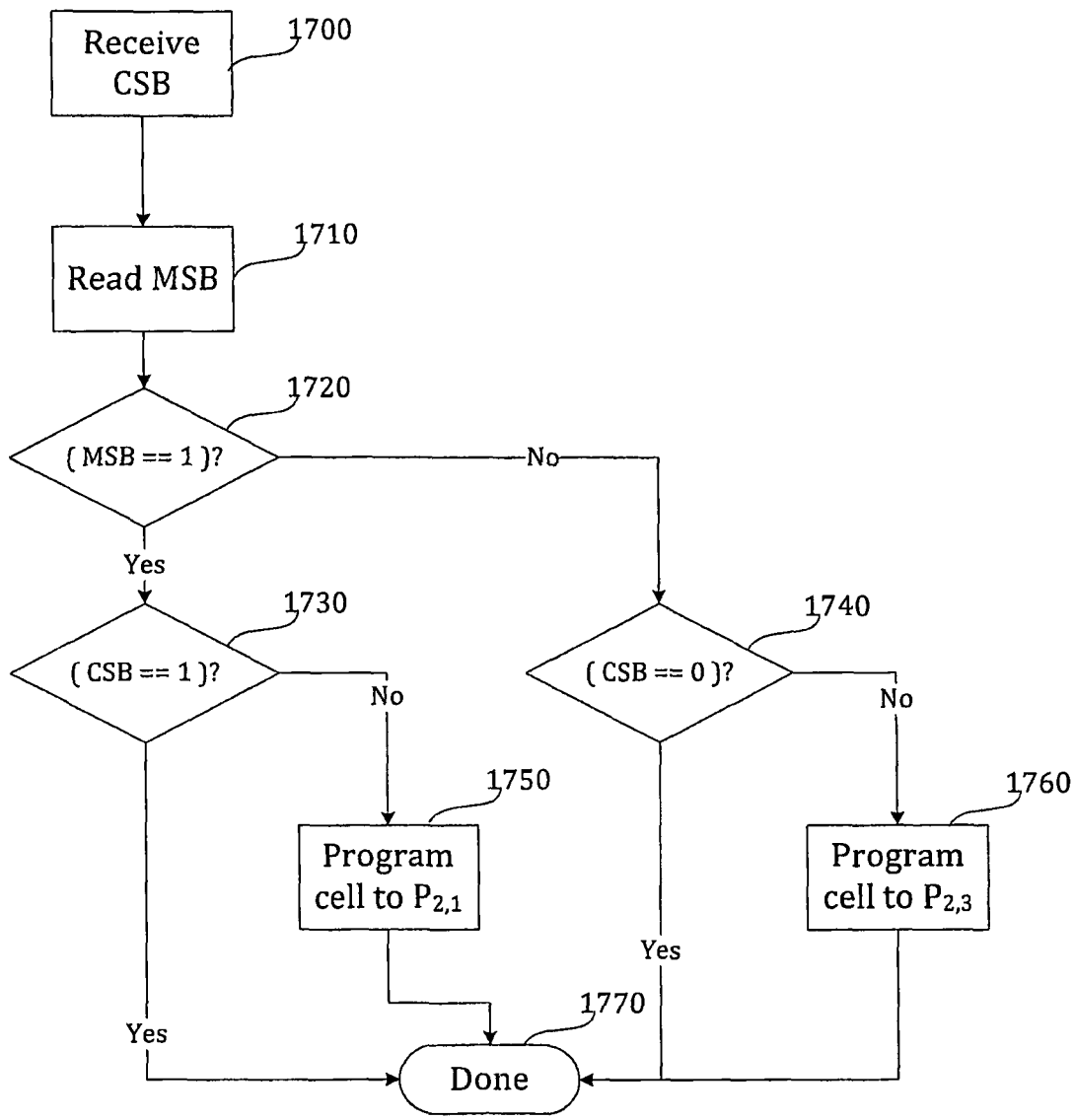
FIG. 13 is a simplified flowchart illustration of a cycle-count depending CSB programming method suitable for cells with a low cycle count, the method being operative in accordance with certain embodiments of the present invention.

When the bit of centered significance (CSB) is programmed, then if the MSB of the same cell equals 1, the cell is left in the erase state if the value of the CSB equals 1, and programmed to program level $P_{2,1}$, if the value of the CSB equals 0. If on the other hand, the value of the MSB of the same cell equals 0, then if the value of the CSB equals 0, the cell is programmed to program level $P_{2,2}$, and if the value of the CSB equals 1, the cell is programmed to program level $P_{2,3}$. It follows that a cell whose MSB and CSB were programmed has one of four (4) program levels (including the erase state). The programming procedure for the CSB is depicted in FIG. 13.

Figure 16:
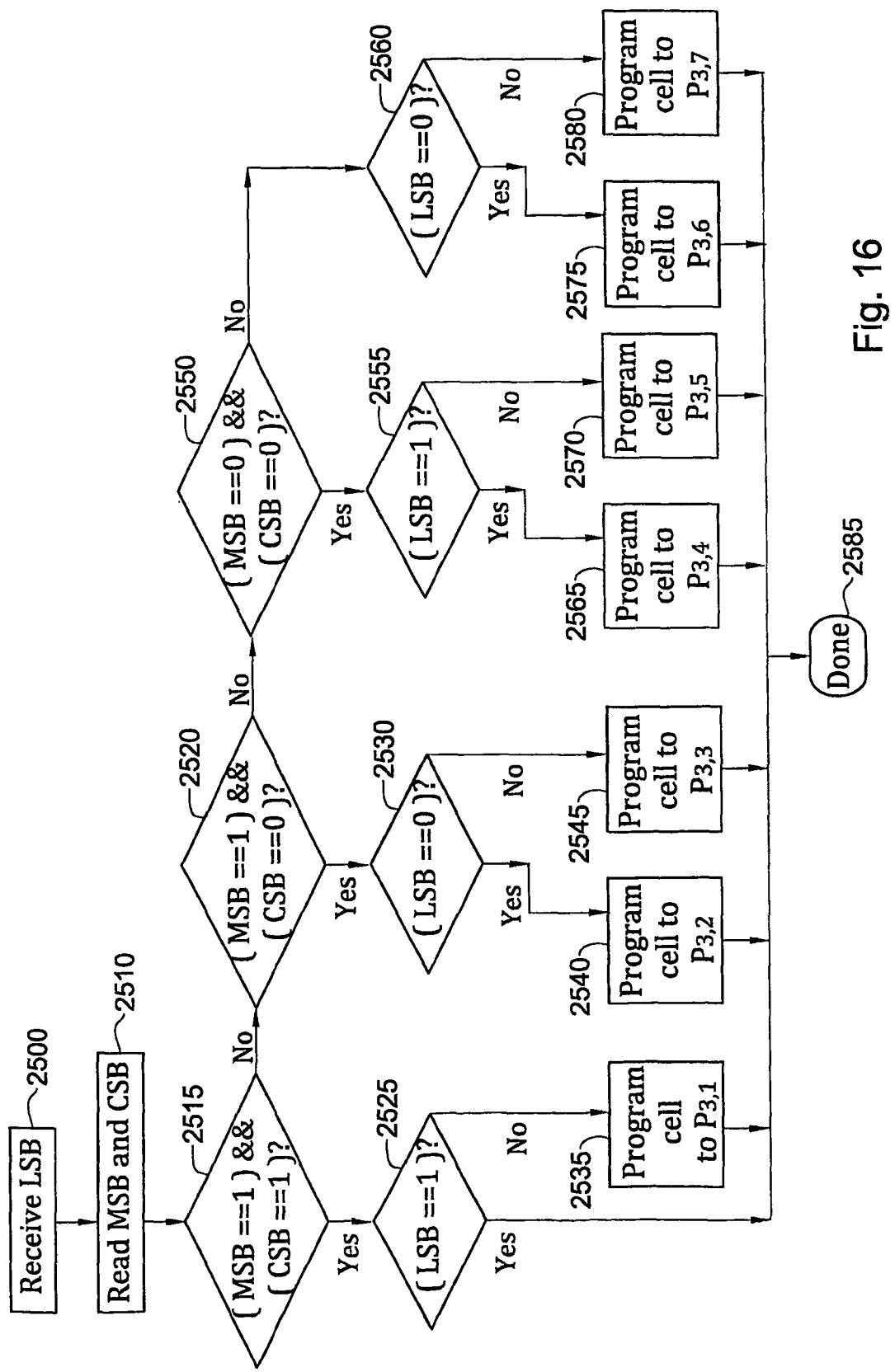
FIG. 16 is a simplified flowchart illustration of a cycle-count dependent LSB programming method suitable for cells with a high cycle count, the method being operative in accordance with certain embodiments of the present invention.

When the least significant bit (LSB) is programmed, then if the cell is in the erased state (corresponding to the MSB and CSB being equal to 1 and 1, respectively) then if the value of the LSB equals 1, the cell is left in the erase state, and if the value of the LSB equals 0, the cell is programmed to program level $P_{3,1}$. If the cell is in program level $P_{2,1}$ (corresponding to the MSB and CSB being equal to 1 and 0, respectively) then if the value of the LSB equals 0, the cell is programmed to program level $P_{3,2}$, and if the value of the LSB equals 1, the cell is programmed to program level $P_{3,3}$. If the cell is in program level $P_{2,2}$ (corresponding to the MSB and CSB being equal to 0 and 0, respectively) then if the value of the LSB equals 1, the cell is programmed to program level $P_{3,4}$, and if the value of the LSB equals 0, the cell is programmed to program level $P_{3,5}$. Finally, If the cell is in program level $P_{2,3}$ (corresponding to the MSB and CSB being equal to 0 and 1, respectively) then if the value of the LSB equals 0, the cell is programmed to program level $P_{3,6}$, and if the value of the LSB equals 1, the cell is programmed to program level $P_{3,7}$. The programming procedure for the LSB is depicted in FIG. 16.

One advantage to programming the cells in such a way is that this reduces the effects of coupling between adjacent cells in the memory array. If, at each time, only one bit is programmed to a cell, then the changes in threshold voltage occur only within a small voltage window. This reduces the interference which adjacent cells experience due to the programming of their neighboring cells. The procedure outlined above is typically referred to as decoupling.

Typically, programming of a cell to a given threshold voltage (or charge level) involves applying a sequence of program pulses with increasing levels of voltage on the cell's gate—causing the insertion of electric charge into the floating gate. After each pulse is applied, the threshold level of the cell is measured. If the target level has been reached, no further program pulses are applied to this cell. If, on the other hand, the target threshold voltage has not been reached, the program pulses are continued.

Such a scheme is known as Incremental Step pulse Programming (ISPP) and is described e.g. in the above-referenced Brewer and Gill publication. In this scheme, after an initial (e.g., 15 V) program pulse, each subsequent pulse, if any, is incremented in (e.g., ~0.5 V) steps up to a higher voltage (e.g., 20 V), Since sufficiently programmed cells are automatically disconnected from the voltage sequence in the verification step, easily programmed cells are not affected by the higher program level. The Incremental Step pulse Programming scheme overcomes the problem of different programming times being employed for different cells without causing easy-to-program cells to be over-programmed. A simplified illustration of an Incremental Step pulse Programming method appears in FIG. 17.

The Incremental Step pulse Programming step parameter influences both the programming speed and the narrowness of the program level distribution. A higher value of the Incremental Step pulse Programming step enables the cells to reach their target threshold voltage or charge level after a smaller number of programming pulses, hence the programming speed increases. However, the larger step will also cause some cells to be programmed further away from the target program level, thus resulting in a wider distribution of the cell's threshold voltages. Conversely, a lower Incremental Step pulse Programming step voltage achieves a tighter Vt distribution while lengthening the program time.

Figure 2:
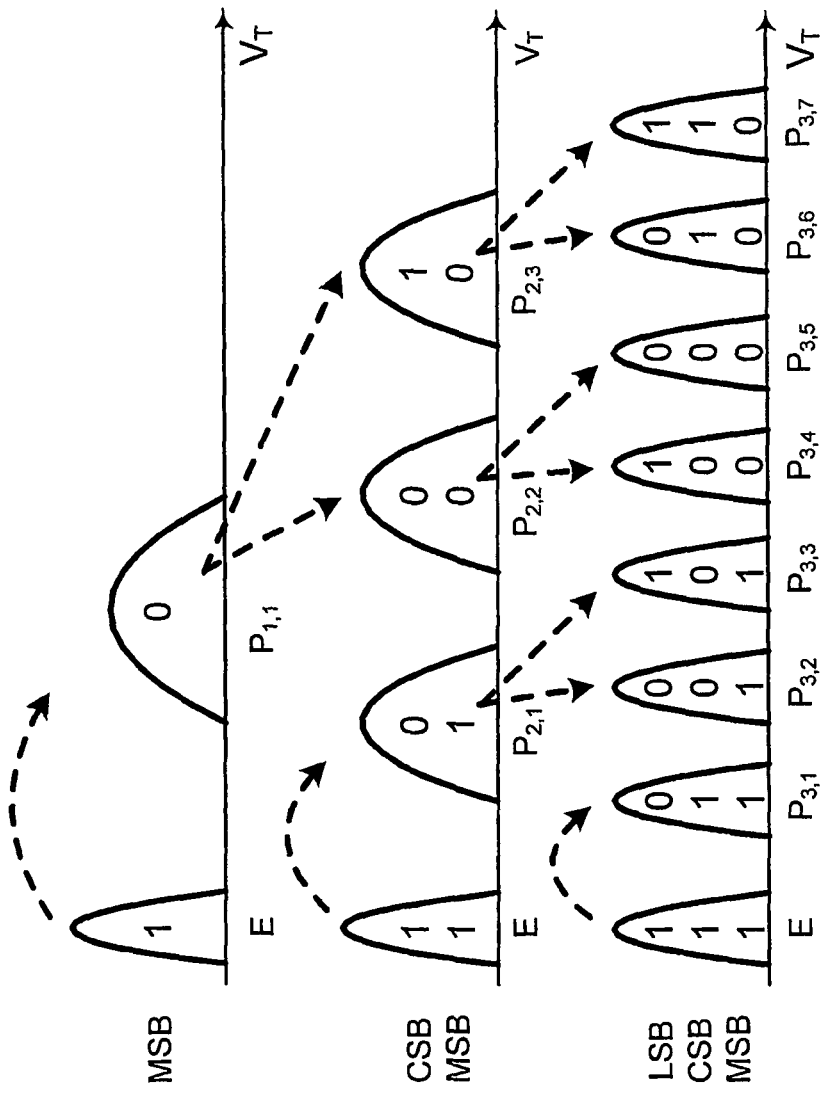
FIG. 2 is a prior art diagram of a procedure for writing program levels in stages, where in each stage only a single bit is programmed, the procedure being suitable for a flash memory device storing 3 bits per cell.

In state-of-the-art flash devices, different Incremental Step pulse Programming steps may be used to program the MSB, CSB, or LSB. When programming the MSB, since only two program levels are present, a larger standard deviation (STD) can be tolerated, and so a larger Incremental Step pulse Programming step voltage may be used. When programming the CSB, slightly smaller Incremental Step pulse Programming voltages may be employed to keep the standard deviation at a level which is acceptable for the error correcting code. Finally, programming of the LSB typically employs the smallest Incremental Step pulse Programming step. The relative sizes of the standard deviations of the program level distributions corresponding to MSB, CSB, and LSB are represented in FIG. 2 by their relative thicknesses.

In some state-of-the-art flash devices, some periodic irregularities are noticed with respect to the program level statistical behavior in different rows in an erase sector. Specifically, the mean of the program level distributions in the first and last rows in the erase sector are significantly shifted with respect to the corresponding means of the program level distributions in other rows in the erase sector. The implications of such a phenomenon are that any set of read thresholds which is suited for, say, the first row in an erase sector, might not be suited, e.g. cause too many errors, when employed in the second or third row. Such a situation might put an extra burden on the controller which may have to obtain a new set of read threshold whenever it reaches a row which possesses the above irregularities.

Certain embodiments of the present invention seek to expedite the programming of a flash memory device by employing cycle based adaptive programming.

Certain embodiments of the present invention seek to expedite programming of a flash memory device by employing skipped programming.

Certain embodiments of the present invention seek to compensate for poor quality rows, e.g. by selecting row-appropriate program levels.

Certain embodiments of the present invention seek to expedite programming of MLC flash memory devices. One such embodiment includes adaptively changing the programming parameters as a function of the cycle count of the device. Specifically, devices, or sectors within a device, which have undergone a small number of program/erase cycles and hence are less susceptible to future retention effects, are programmed using high Incremental Step pulse Programming step voltage. As the number of program/erase cycles increases, such that the expected deterioration due to retention increases as well, programming is done more accurately using lower Incremental Step pulse Programming step voltages. Finally, when the cycle count of a device reaches, say, several hundred, the Incremental Step pulse Programming step with smallest voltage is typically used, if it is desired to restrict the expected impact of retention to the minimum required for successful reading. The usage of high-voltage Incremental Step pulse Programming steps for lower cycle count sectors enables the overall average programming time to be decreased. Another MLC flash programming expediting embodiment includes skipping the programming of certain program levels and using instead the program levels of the previous stage. Specifically, the positive program level of the MSB is chosen as a subset of the program levels of the CSB, and the positive program levels of the CSB are chosen as a subset of the program levels of the LSB. This conserves time associated with the programming whenever the desired program level is just the one in which the cell is already programmed.

Certain embodiments of the present invention seek to improve the read efficiency of the flash device by employing row-based adaptive programming. These embodiments may include adaptively changing the programming parameters as a function of the row number within the erase sector in which the data is written. Specifically, rows within an erase sector which exhibit a shift of the means of their program level distributions with respect to other rows within the erase sector are programmed with different program levels than the other rows in the erase sector. The row based adaptive programming causes the statistical behavior of the program levels of all the rows in the erase sector to appear the same when read is carried out on this erase sector. The applicability of row-based adaptive programming is not limited to situations in which certain rows have inherently poor quality and instead, is more generally applicable to any situation in certain rows within one erase sector, which behave very non-uniformly when they are read.

It is appreciated that conflicting considerations may optionally cause Incremental Step pulse Programming steps with larger voltages to be used, at times, even when the cycle count is large. Conversely, conflicting considerations may optionally cause Incremental Step pulse Programming steps with smaller voltages to be used, at times, even when the cycle count is still small. The invention shown and described herein is intended to include any applications in which the cycle count is one of the considerations, although perhaps not the sole consideration, governing the voltage level of programming pulses.

Consider, as an example, a baseline system of a flash memory device where each cell has 8 possible charge levels (or program levels), thus storing 3 bits per cell, and where each erase sector contains 32 rows. That said, this invention is also applicable to flash devices with less or more charge levels and/or less or more rows per erase sector. Each of the 3 bits may be programmed separately using different programming pulses and different Incremental Step pulse Programming step voltages.

Figure 3:
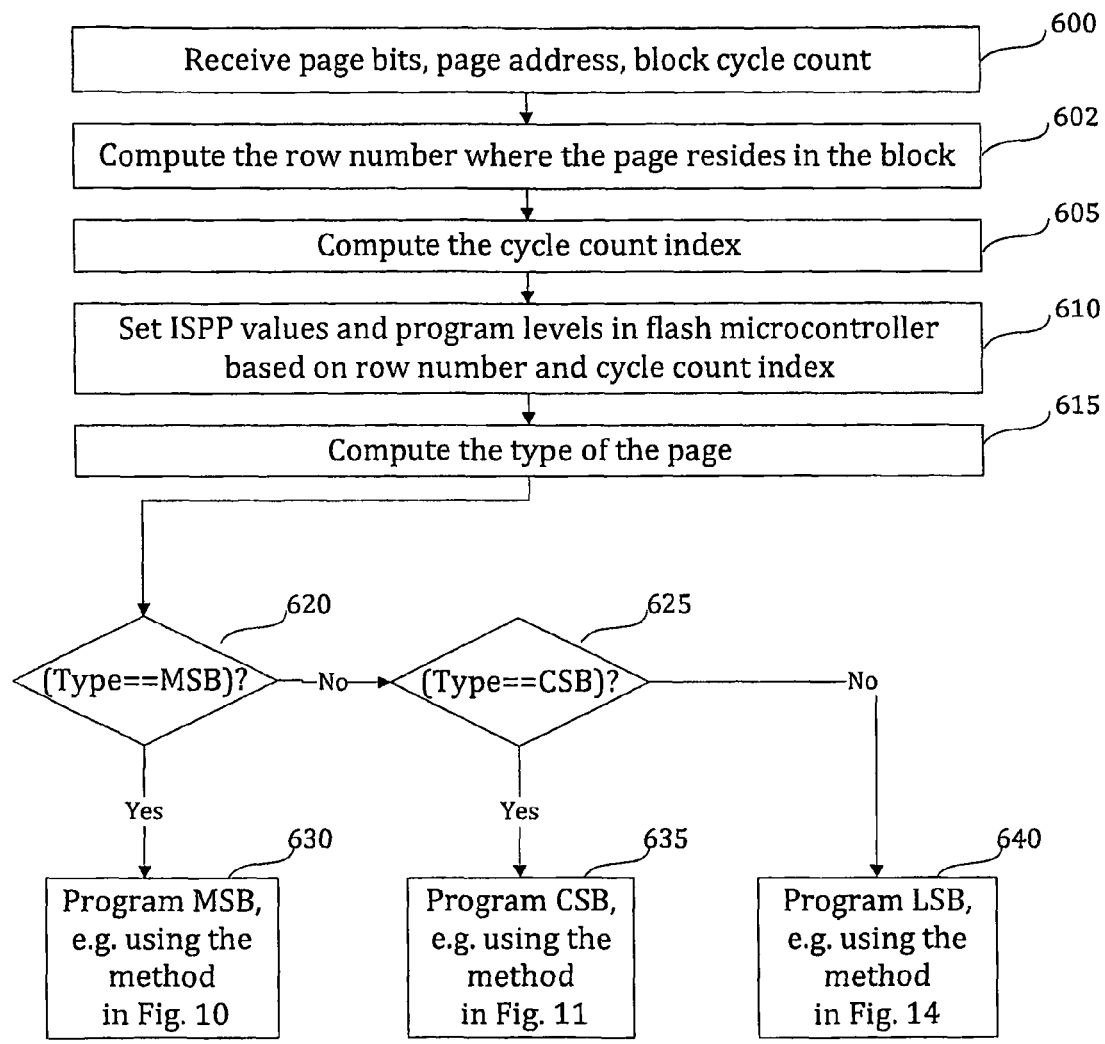
FIG. 3 is a simplified flowchart illustration of an adaptive programming method operative in accordance with certain embodiments of the present invention.
Figure 4:
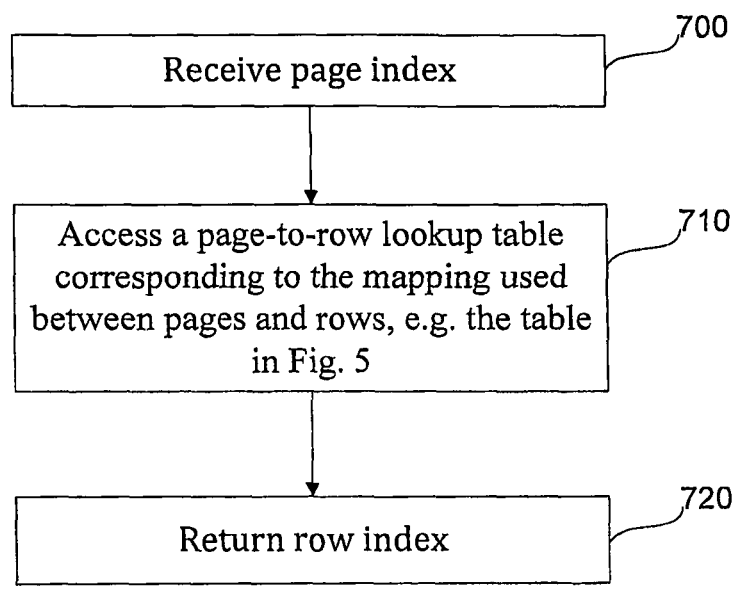
FIG. 4 is a simplified flowchart illustration of a method for performing the page-holding row number computation step of FIG. 3, the method being operative in accordance with certain embodiments of the present invention.

Reference is now made to FIGS. 3-21 which illustrate certain embodiments of the present invention. Specifically, FIG. 3 is a simplified flowchart illustration of a adaptive programming method operative in accordance with certain embodiments of the present invention. FIG. 4 is a simplified flowchart illustration of a method for performing the page-holding row number computation step 602 of FIG. 3, the method being operative in accordance with certain embodiments of the present invention.

FIG. 5 is a page-to-row table used by the method of FIG. 4 in accordance with certain embodiments of the present invention.

Figure 6:
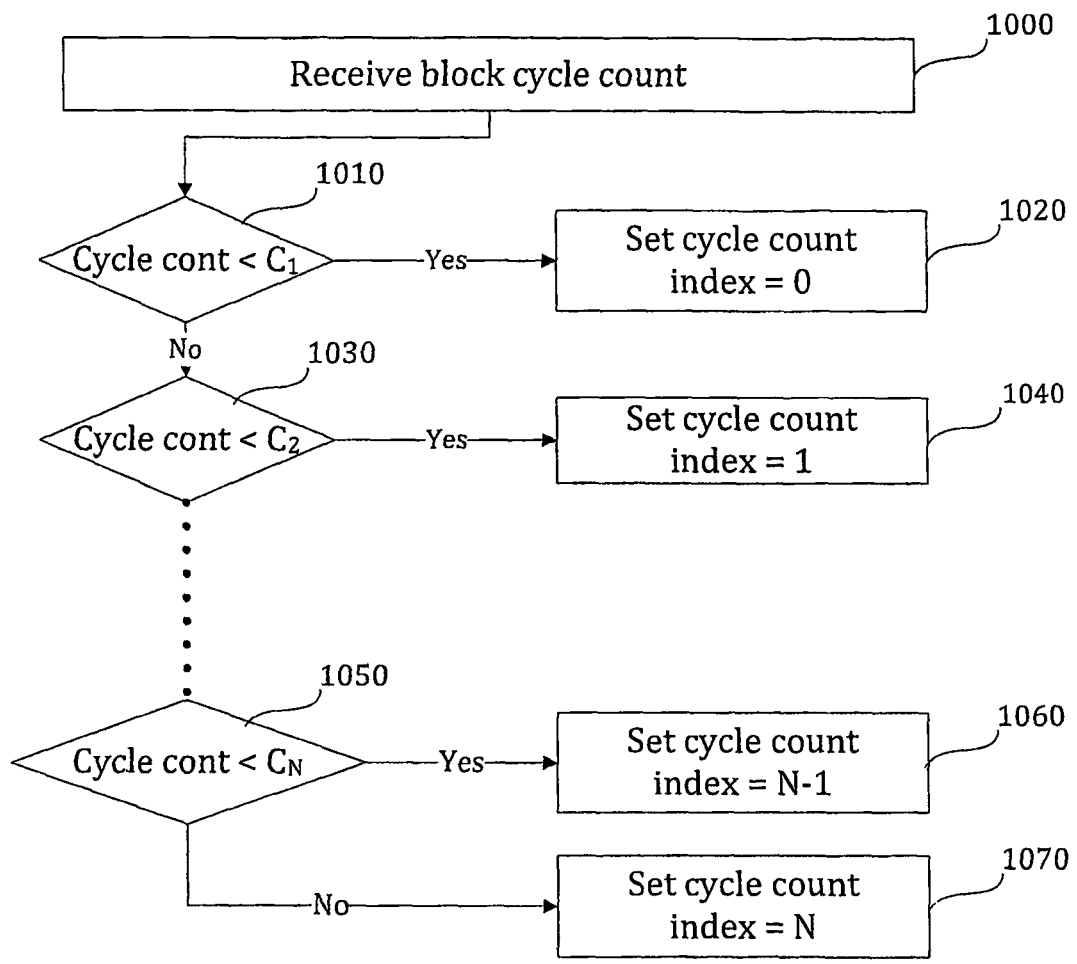
FIG. 6 is a simplified flowchart illustration of a method for performing the cycle count index computing step of FIG. 3, the method being operative in accordance with certain embodiments of the present invention.
Figure 8:
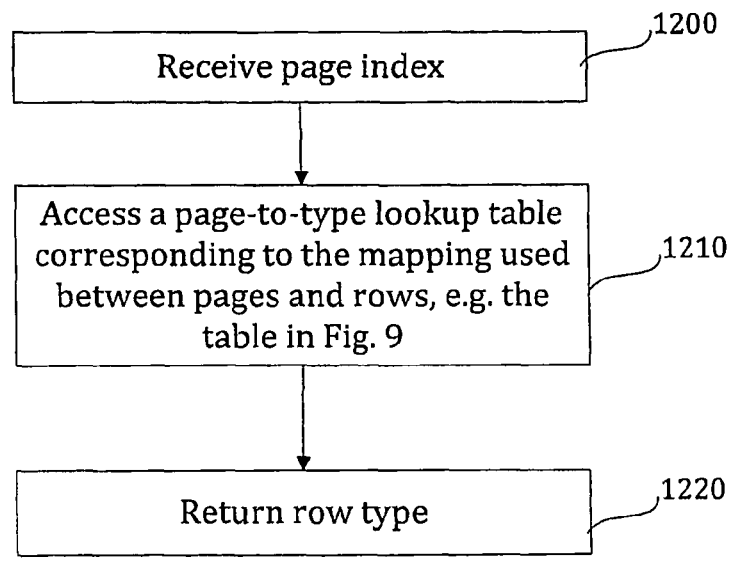
FIG. 8 is a simplified flowchart illustration of a method for performing the page type determination step of FIG. 3, the method being operative in accordance with certain embodiments of the present invention.
Figure 7:
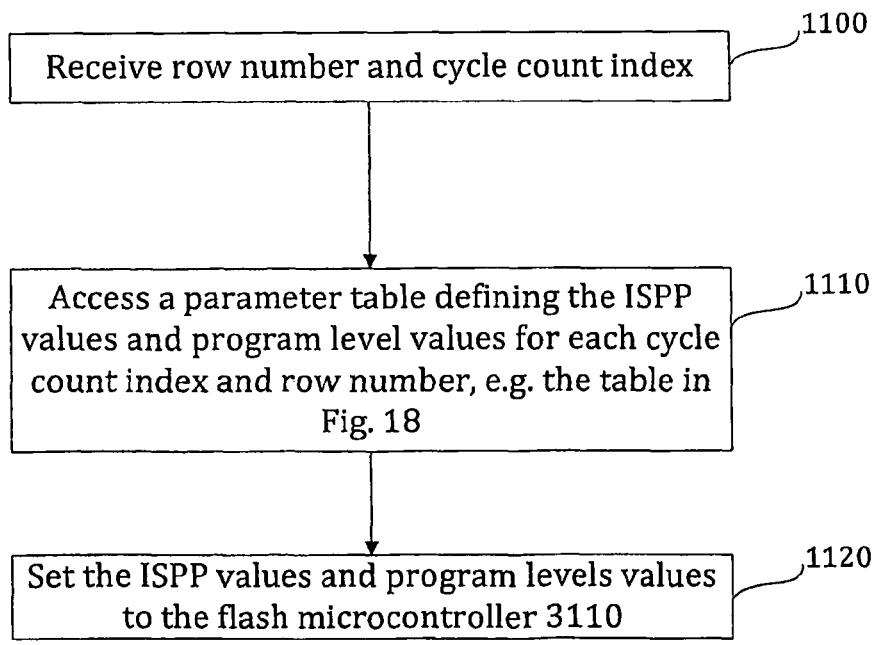
FIG. 7 is a simplified flowchart illustration of a method for performing the program level and Incremental Step pulse Programming value setting step of FIG. 3, the method being operative in accordance with certain embodiments of the present invention.

FIG. 6 is a simplified flowchart illustration of a method for performing the cycle count index computing step 605 of FIG. 3, the method being operative in accordance with certain embodiments of the present invention. FIG. 7 is a simplified flowchart illustration of a method for performing the program level and Incremental Step pulse Programming value setting step 610 of FIG. 3, the method being operative in accordance with certain embodiments of the present invention. FIG. 8 is a simplified flowchart illustration of a method for performing the page type determination step 615 of FIG. 3, the method being operative in accordance with certain embodiments of the present invention. An example of the page-to-type lookup table used by step 1210 in FIG. 8 is shown in FIG. 9. FIG. 10 is a simplified flowchart illustration of a method for performing the MSB programming step 630 of FIG. 3.

Figure 11:
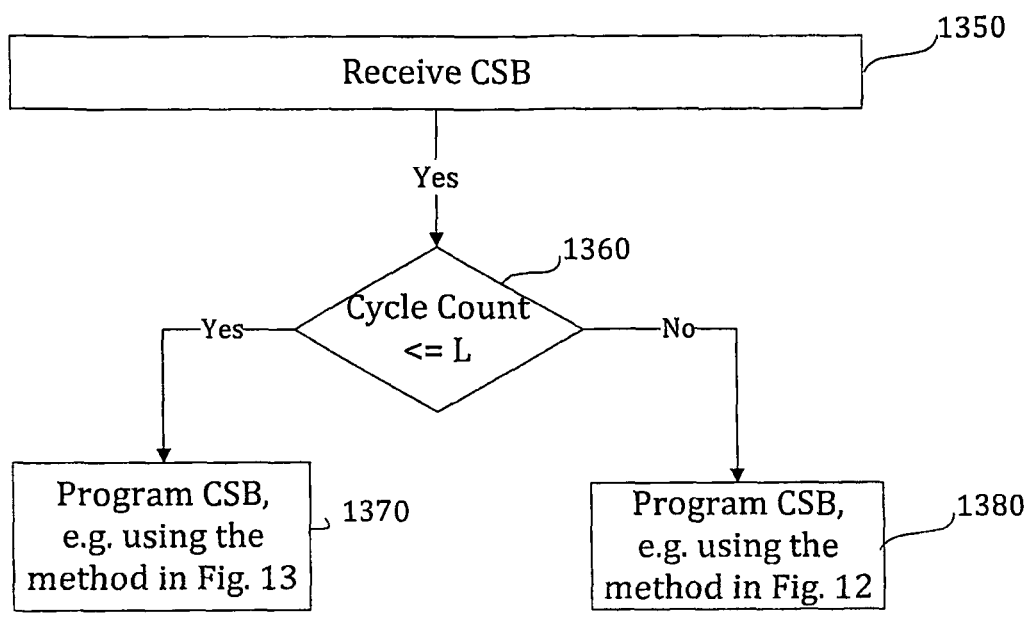
FIG. 11 is a simplified flowchart illustration of a method for performing the CSB programming step of FIG. 3, the method being operative in accordance with certain embodiments of the present invention.
Figure 12:
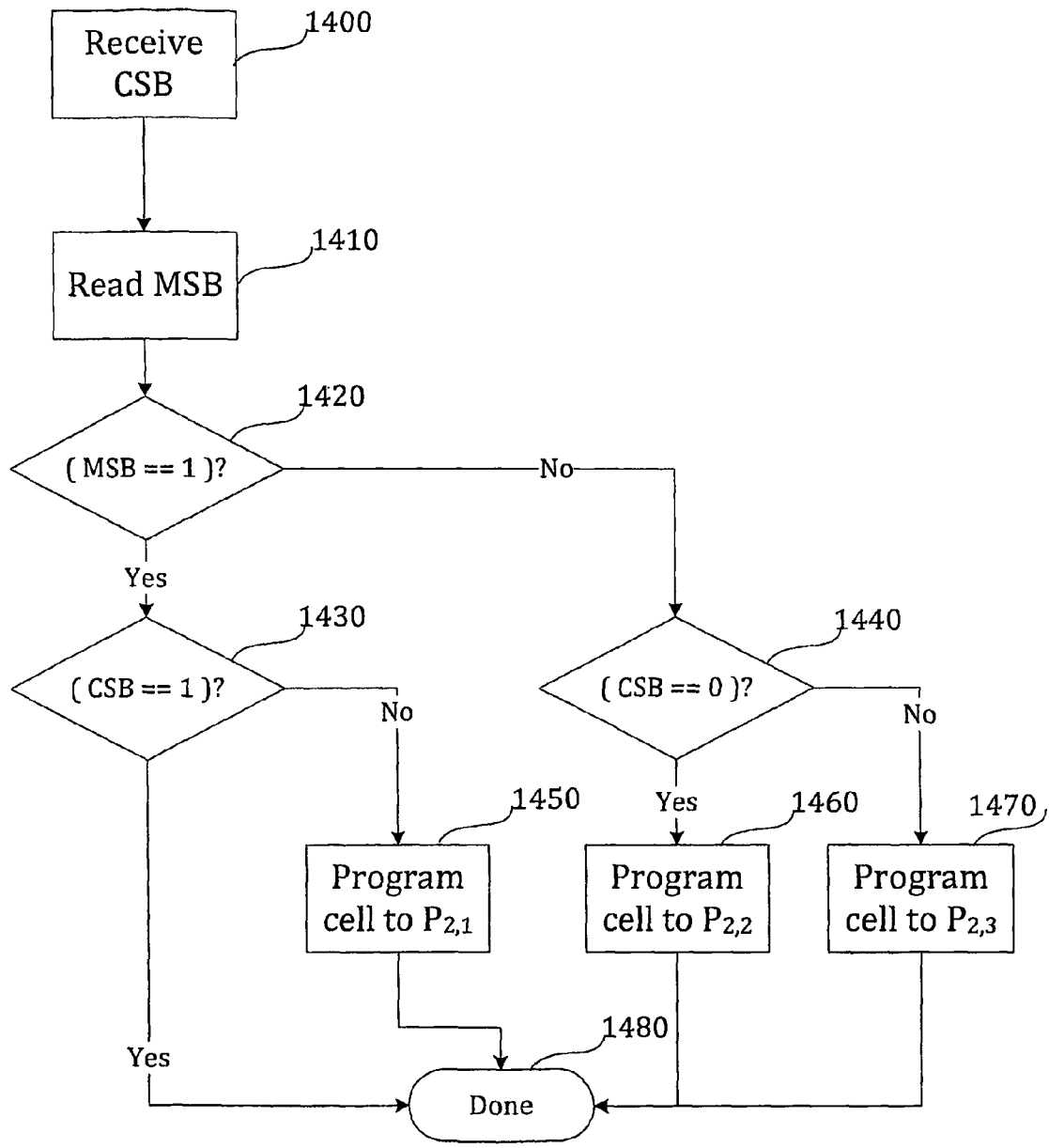
FIG. 12 is a simplified flowchart illustration of a cycle-count dependent CSB programming method suitable for cells with a high cycle count, the method being operative in accordance with certain embodiments of the present invention.

Reference is now made to FIG. 11 which is a simplified flowchart illustration of a method for performing the CSB programming step 635 of FIG. 3. FIG. 12 is a simplified flowchart illustration of a cycle-count dependent CSB programming method suitable for cells with a high cycle count, the method being operative in accordance with certain embodiments of the present invention to implement step 1380 of FIG. 11. FIG. 13 is a simplified flowchart illustration of a cycle-count depending CSB programming method suitable for cells with a low cycle count, the method being operative in accordance with certain embodiments of the present invention to implement step 1370 of FIG. 11.

Figure 14:
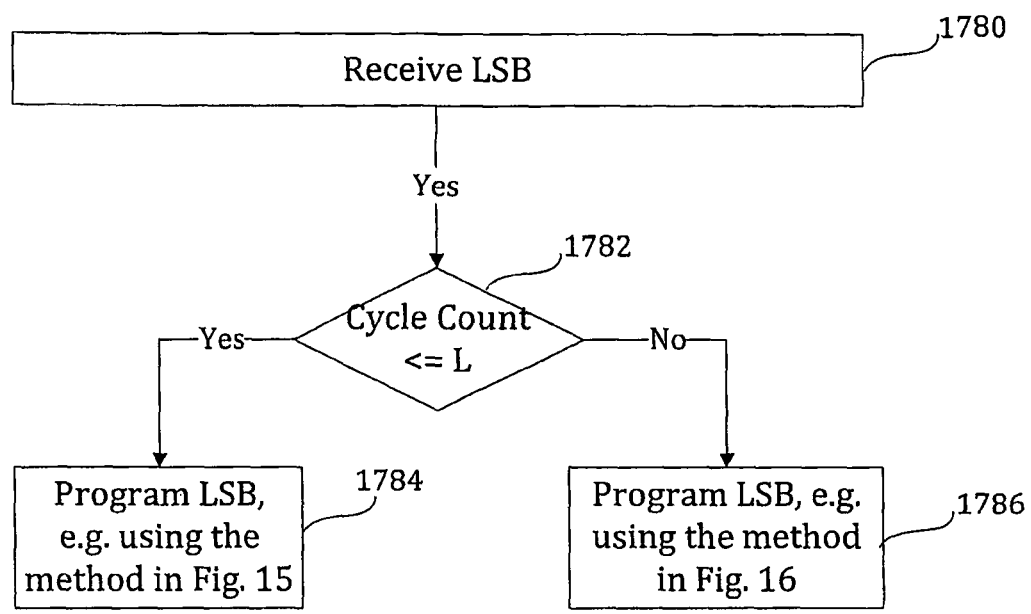
FIG. 14 is a simplified flowchart illustration of a method for performing the LSB programming step of FIG. 3, the method being operative in accordance with certain embodiments of the present invention.

FIG. 14 is a simplified flowchart illustration of a method for performing the LSB programming step 640 of FIG. 3.

Figure 15:
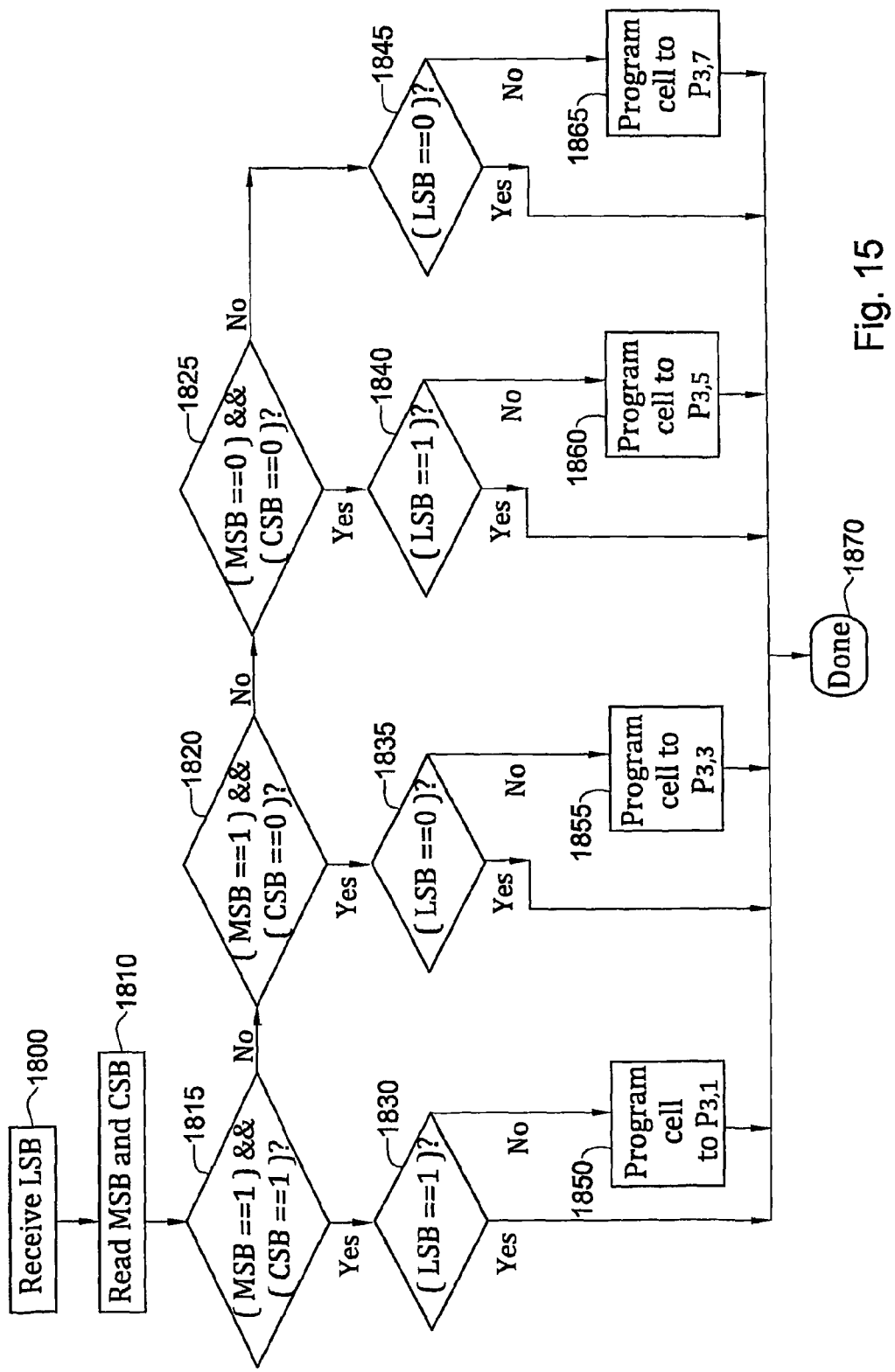
FIG. 15 is a simplified flowchart illustration of a cycle-count dependent LSB programming method suitable for cells with a low cycle count, the method being operative in accordance with certain embodiments of the present invention.

FIG. 15 is a simplified flowchart illustration of a cycle-count dependent LSB programming method suitable for cells with a low cycle count, the method being operative in accordance with certain embodiments of the present invention to implement step 1784 of FIG. 14.

FIG. 16 is a simplified flowchart illustration of a cycle-count dependent LSB programming method suitable for cells with a high cycle count, the method being operative in accordance with certain embodiments of the present invention to implement step 1786 of FIG. 14.

Figure 17:
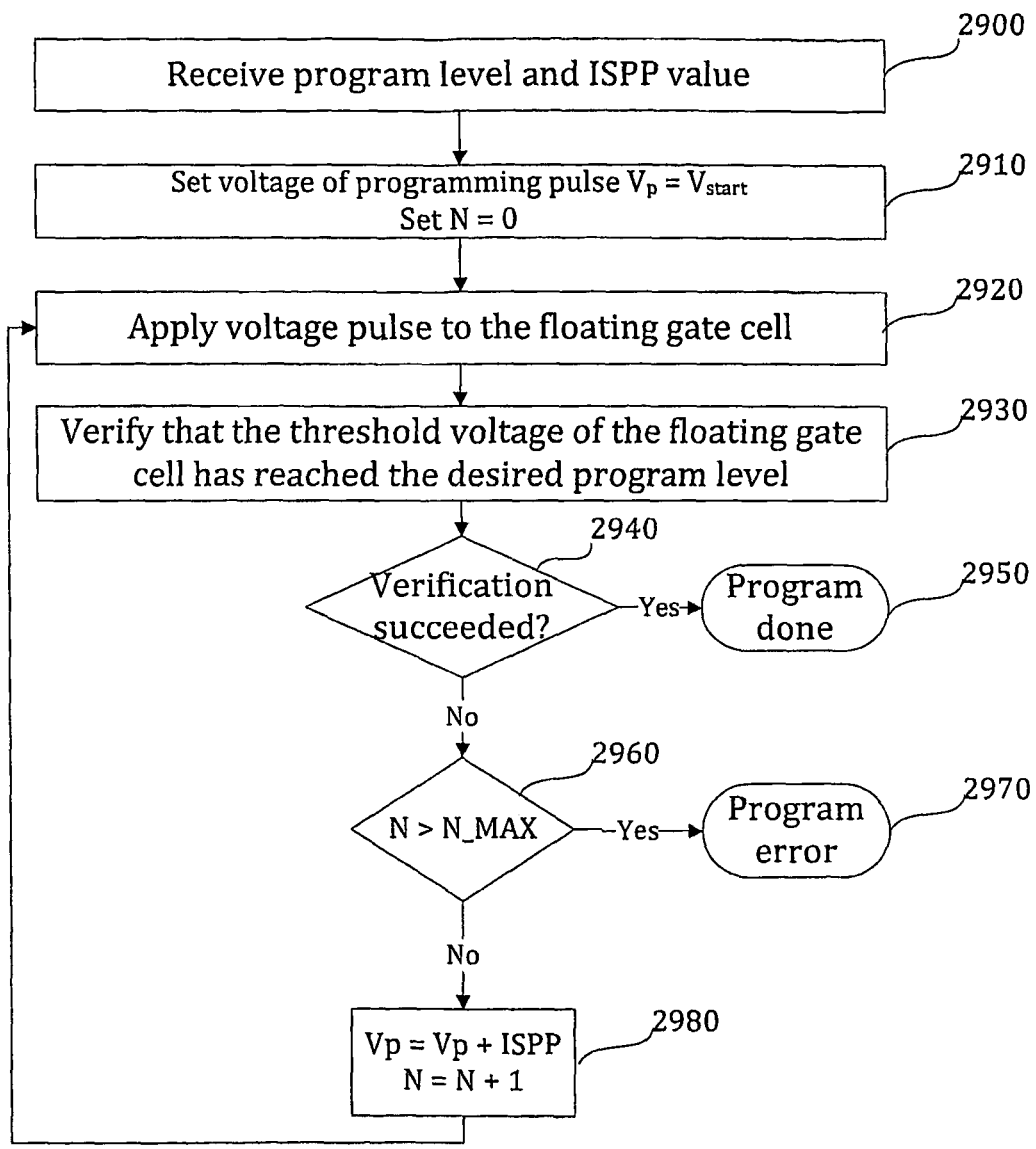
FIG. 17 is a simplified flowchart illustration of a cell programming method useful in implementing each of the cell programming operations illustrated herein e.g.

FIG. 17 is a simplified flowchart illustration of a cell programming method useful in implementing each of the cell programming operations illustrated herein e.g. operations 1320, 1450, 1460, 1470, 1750, 1760, 1850, 1855, 1860, 1865, 2535, 2540, 2545, 2565, 2570, 2575 and 2580 in FIGS. 10, 12-13, 15-16, which differ as to the program level to which the cell is to be programmed, all in accordance with certain embodiments of the present invention.

FIG. 3 is now described in detail. In certain embodiments of this invention, the controller receives a page to be written to the flash, and a page address (or number). The address also indicates to which erase sector the page belongs. The controller is operative to keep track of the number of program/erase cycles each erase sector has undergone. In step 602 the controller computes the row number in which the page resides, e.g. using the method in FIG. 4. In step 605 the controller computes the cycle count index of the erase block to which the page will be written. In step 610, the controller sets the values for the programming parameters based on the row number or the cycle count or both. In step 615, the controller selects either an MSB programming process, or a CSB programming process, or an LSB programming process. Programming is then performed using the parameters which were selected as detailed above.

A method for cycle count dependent adaptive programming operative in accordance with certain embodiments of the present invention is now described. It is known, e.g. as described in the above-referenced Brewer and Gill publication, that the degradation of a flash device, in terms of the increase in the standard deviation level of the program level distribution due to retention, is more severe when the device is heavily cycled prior to programming. Devices which are only lightly cycled suffer less from retention. It follows that Incremental Step pulse Programming step voltages which are generally used for programming MSBs, can be used to program CSBs providing the cycle count of the flash device is relatively low. This is because, although the usage of a larger Incremental Step pulse Programming step will increase the standard deviation, the expected degradation due to retention is expected to be limited, and the error correcting code will be able to correct all the bit errors. Similarly, Incremental Step pulse Programming step voltages which were used to program CSBs can be used to program LSBs when the flash devices have undergone few, if any, program/erase cycles.

FIG. 18 and FIG. 19 contain programming parameters which are used, according to certain embodiments of the present invention, to program even pages and odd pages. Each row in the tables corresponds to a cycle count range. For instance, the first row whose cycle count index is 0 is used for programming flash devices which have undergone at most 200 program/erase cycles. The second row in each table is used for programming flash devices which have undergone between 201 and 500 program/erase cycles. Finally, the last row in each table whose cycle count index is 4 is used for programming flash devices which have undergone more than 2000 program/erase cycles.

In the tables in FIG. 18 and FIG. 19, the column Incremental Step pulse Programming corresponds to the Incremental Step pulse Programming step voltage used for programming the MSB, CSB, and LSB, respectively. In a certain embodiment of this invention, the tables in FIG. 18 and FIG. 19 are used to determine which Incremental Step pulse Programming step voltages are used. For instance, it can be seen that for devices with low cycle count, the Incremental Step pulse Programming step used to program LSB is larger for devices with low cycle counts, and conversely, the Incremental Step pulse Programming step used to program LSB is smaller for devices with large cycle count. For example, even LSB pages in row 0 are programmed with Incremental Step pulse Programming step of 0.4 V for flash devices with less than 200 program/erase cycles, while the same pages are programmed using an Incremental Step pulse Programming step of 0.2 V for flash devices which have undergone more than 2000 program/erase cycles.

In certain embodiments of this invention, the program levels are chosen as a function of the cycle count. One advantage of this embodiment is that it enables to save time in programming flash devices which were not cycled heavily, while not affecting the read performance of flash devices which were heavily cycled.

A method for row dependent adaptive programming operative in accordance with certain embodiments of the present invention is now described.

According to certain embodiments of this invention, the programming parameters used to program a page into the flash memory are selected as a function of the row number. The tables in FIG. 18 and FIG. 19 have separate columns for row 0, rows 1-30, and row 31. In certain embodiments of this invention, prior to programming a page into the flash memory, the controller checks to which row the page is to be programmed. The controller then uses the appropriate values from the table according to the row number. In certain embodiments of this invention, if the row number is 0, the programming parameters are taken from the column designated as "Row 0". If the row number is between 1-30, the programming parameters are taken from the column designated as "Row 1-30". Finally, for pages written to rows 31, the programming parameters are taken from column "Row 31". One advantage of this embodiment is in its ability to handle rows with different statistical behavior within a single erase sector in the programming stage, such that during the read operation, the rows appear statistically the same, obviating any need to calibrate read threshold for each row individually.

A method for skipped programming operative in accordance with certain embodiments of the present invention is now described.

In certain embodiments of this invention, the procedure outlined in FIG. 12 for programming the CSB is altered. Specifically, the positive program level of the MSB is chosen as a subset of the program levels of the CSB. FIG. 13 is a simplified flowchart illustration of a method for programming the CSB with skipped programming. As opposed to the implementation of FIG. 12, no programming is required whenever the MSB equals 0 and the CSB equals 0.

The method of FIG. 16 for programming the LSB may be modified: the positive program level of the CSB may be selected as a subset of the program levels of the LSB. FIG. 15 is a simplified flowchart illustration of a method for programming the LSB with skipped programming. As opposed to the implementation depicted in FIG. 16, no programming is required whenever the MSB, CSB, and LSB equal either (1, 0, 0), (0, 0, 1), or (0, 1, 0), respectively.

An advantage of using the skipped programming, according to certain embodiments, is that the total number of programming operations is reduced with respect to the standard implementation, In certain embodiments of the present invention, the skipped programming is used only if the cycle count of the flash device is lower than some number.

FIG. 11 is a simplified flowchart illustration of a method for performing programming of a CSB. In certain embodiments of this invention, the controller compares the cycle count of the erase sector to which the page is to be programmed. If this cycle count is lower than a threshold value L (e.g. ~100), the controller uses the skipped programming method of FIG. 13. Otherwise, the controller uses the method of FIG. 12.

FIG. 14 is a simplified flowchart illustration of a method for performing programming of an LSB. In certain embodiments of this invention, the controller compares the cycle count of the erase sector to which the page is to be programmed. If this cycle count is lower than a threshold value L (e.g. ~100), the controller uses the skipped programming method of FIG. 15. Otherwise, the controller uses the method of FIG. 16.

One advantage of using the skipped programming when the cycle count of the flash device is low may be that the total number of programming operations may be reduced, relative to conventional implementations, whenever the cycle count of the device is relatively low. When the cycle count is low, some of the program levels distribution lobes of FIG. 1 can be allowed to be "thick", since the expected widening of the distribution due to retention is expected to be limited.

In certain embodiments of the present invention, the thresholds governing the skipped programming usage can be set differently for either the CSB programming or the LSB programming depending on the particular behavior of the NAND flash device as revealed by offline experiments.

Figure 20:
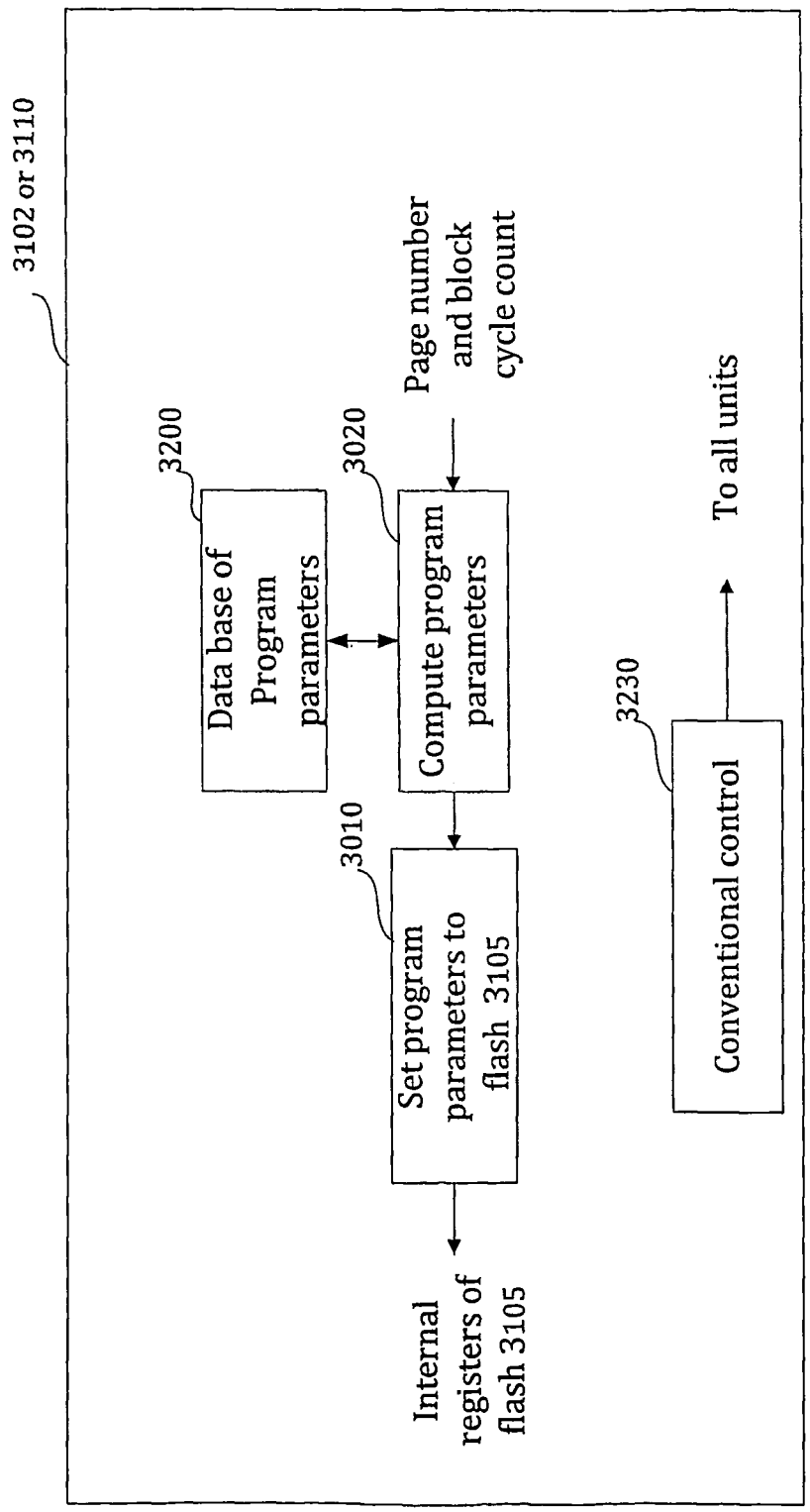
FIG. 20 is a simplified functional block diagram of an adaptively programming controller which programs Incremental Step pulse Programming step voltage and/or performs skipped and/or row-dependent programming and which is constructed and operative in accordance with certain embodiments of the present invention.

FIG. 20 is a simplified functional block diagram of an adaptively programming controller which programs Incremental Step pulse Programming step voltage and/or performs skipped and/or row-dependent programming. Specifically, the controller of FIG. 20 is operative to adaptively program a flash memory device e.g. by programming its Incremental Step pulse Programming step voltage as described above and/or by performing skipped programming as described above and/or by performing row-dependent programming as described above.

Figure 21:
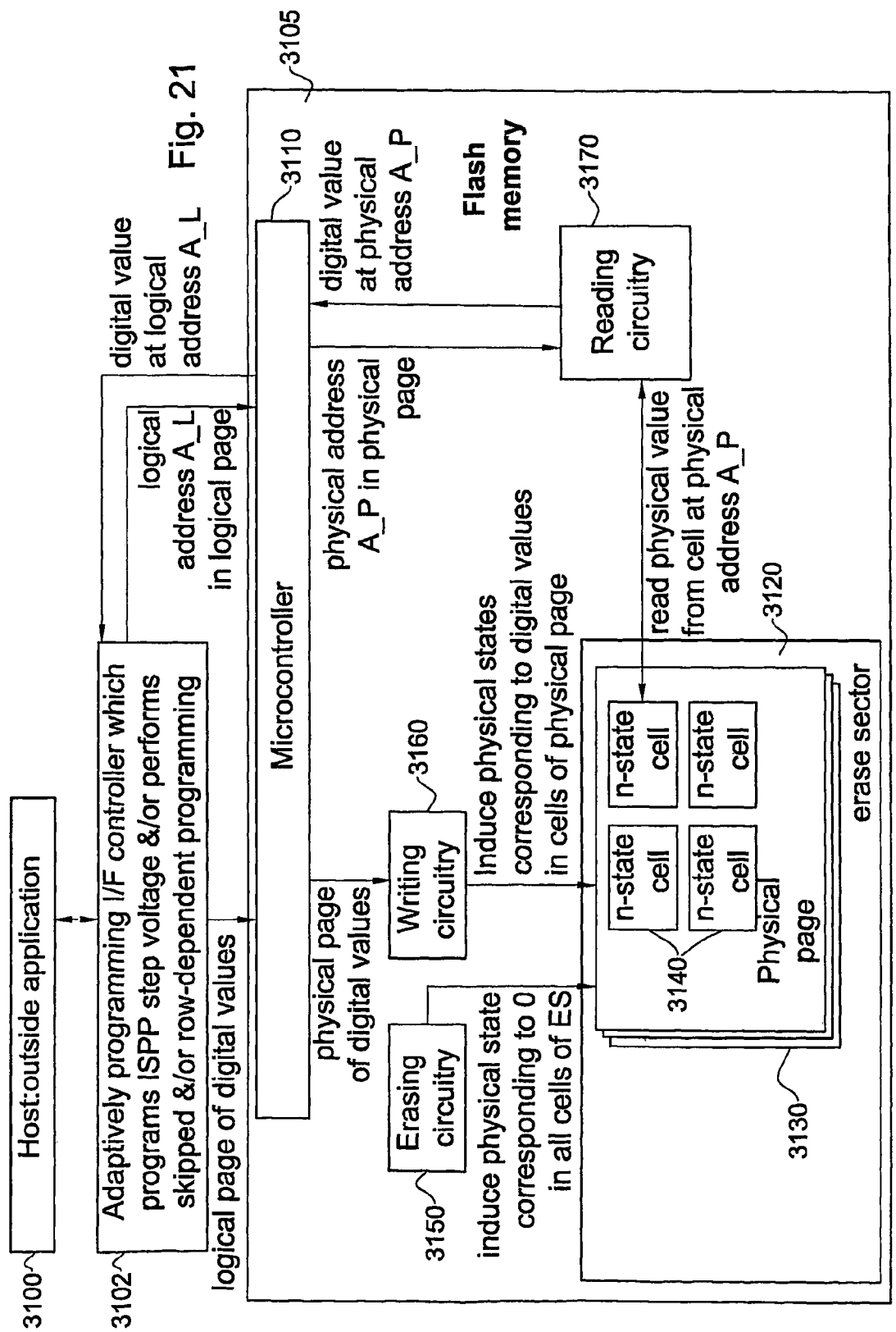
FIG. 21 is a simplified functional block diagram of flash memory apparatus incorporating the controller of FIG. 20 which is constructed and operative in accordance with certain embodiments of the present invention.

FIG. 21 is a simplified functional block diagram of flash memory apparatus incorporating the controller of FIG. 20. As shown, the flash memory system of FIG. 21 includes a host or outside application 3100 which interfaces, via an interface controller 3102, with a flash memory device 3105. An internal microcontroller 3110 typically manages the functional units of the flash memory device 3105. The storage portion of the flash memory device includes one or more typically many erase sectors 3120 each storing one or more typically many physical pages 3130 each including one or more typically many cells 3140 having more than one possible state such that logical values may be stored therein. Erasing circuitry 3150 is provided to erase data from cells, writing circuitry 3160 writes data into cells, and reading circuitry 3170 reads data from cells. Typically, the controller of FIG. 20 is incorporated in the external I/F controller 3102 although alternatively, some or all of the functionality of the controller of FIG. 20 may be incorporated in an internal microcontroller 3110 which is disposed internally of a flash memory device 3105.

When the Incremental Step pulse Programming step voltage programming embodiment shown and described herein is used, the flash memory device 3105 of FIG. 21 may be similar to conventional Incremental Step pulse Programming flash memory devices except that the Incremental Step pulse Programming step voltage is controllable.

When the skipped programming embodiment shown and described herein is used, the flash memory device 3105 may be similar to conventional flash memory devices except that a user can elect to de-activate some of the programming levels provided by the flash memory device.

When the row dependent embodiment shown and described herein is used, the flash memory device 3105 may be similar to conventional flash memory devices except that the programming levels provided by the flash memory device are programmable rather than being pre-set.

It is appreciated that the various embodiments shown and described herein, e.g. the Incremental Step pulse Programming step voltage programming embodiment, the skipped programming embodiment and the row dependent embodiment, can be practiced either in isolation or in any suitable combination.

The adaptively programming controller of FIG. 20 typically comprises a programming parameter computation unit 3020 which receives information which is used to determine programming parameters, such as page numbers and associated block cycle counts and computes programming parameter values accordingly. Programming parameters may be stored in a suitable database 3200. A parameter setting unit 3010 sets internal parameters residing in internal registers of flash memory device 3105, to values generated by the parameter computation unit 3020. A conventional control unit 3230 controls all units.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix' HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above. The present invention may for example interface with or modify, as per any of the embodiments described herein, one, some or all of the above components.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. A method for rapidly programming at least two bits per cell, in a population of pages belonging to respective erase sectors in flash memory, the population of pages defining a multiplicity of cells, the method comprising: for at least one cell, initially programming at least one first bit into the cell thereby to induce one of a first plurality of program levels in the cell, said first plurality of program levels including an erase level and at least one program level other than the erase level, skipping, while a cycle count of at least one erase sector that comprises the at least one cell have a predeterminedly low cycle count, a subsequence programming of at least one second bit into the cell of a certain program level that differs from the erase level and allowing the cell to remain in a program level of the first plurality of levels; and subsequently programming, after the cycle count of the at least one erase sectors that include the at least one cell exceeds the predeterminedly low cycle count, the at least one second bit into the cell, thereby to induce one of a second plurality of program levels in the cell if the at least one second bit is of a program level that differs from the certain program level.

2. A method according to claim 1 wherein said second plurality of program levels includes all of the program levels in said first plurality of program levels.

3. A method according to claim 1 wherein said at least one cell comprises only cells in pages belonging to erase sectors having a predeterminedly low cycle count.

4. A method according to claim 1 wherein said at least one cell comprises all cells in pages belonging to erase sectors having a predeterminedly low cycle count.

5. A system for rapidly programming at least two bits per cell, in a population of pages belonging to respective erase sectors in flash memory, the population of pages defining a multiplicity of cells, the system comprising: a bit programmer operative to initially program at least one first bit into at least one cell thereby to induce one of a first plurality of program levels in the cell, said first plurality of program levels including an erase level and at least one program level that differs from the erase level, to skip, while a cycle count of at least one erase sector that comprises the at least one cell have a predeterminedly low cycle count, a subsequence programming of at least one second bit into the cell of a certain program level that differs from the erase level and allowing the cell to remain in a program level of the first plurality of levels; and to subsequently program, after the cycle count of the at least one erase sectors that include the at least one cell exceeds the predeterminedly low cycle count, the at least one second bit into the cell, thereby to induce one of a second plurality of program levels in the cell if the at least one second bit is of a program level that differs from the certain program level.

6. A system according to claim 5 wherein said second plurality of program levels includes all of the program levels in said first plurality of program levels.

7. A system according to claim 5 wherein said at least one cell comprises only cells in pages belonging to erase sectors having a predeterminedly low cycle count.

8. A system according to claim 5 wherein said at least one cell comprises all cells in pages belonging to erase sectors having a predeterminedly low cycle count.

9. A method for rapidly programming at least two bits per cell, in a population of pages belonging to respective erase sectors in flash memory, the population of pages defining a multiplicity of cells, the method comprising: initially programming by a bit programmer at least one first bit into at least one cell thereby to induce one of a first plurality of program levels in the cell, said first plurality of program levels including an erase level and at least one program level that differs from the erase level, skipping, while a cycle count of at least one erase sector that comprises the at least one cell have a predeterminedly low cycle count, a subsequence programming of at least one second bit into the cell of a certain program level that differs from the erase level and allowing the cell to remain in a program level of the first plurality of levels; and subsequently programming, after the cycle count of the at least one erase sectors that include the at least one cell exceeds the predeterminedly low cycle count, the at least one second bit into the cell, thereby to induce one of a second plurality of program levels in the cell if the at least one second bit is of a program level that differs from the certain program level.

* * * * *